(12) United States Patent
Jeong et al.

(10) Patent No.: US 9,026,854 B2
(45) Date of Patent: May 5, 2015

(54) METHOD OF TESTING UNIVERSAL FLASH STORAGE (UFS) INTERFACE AND MEMORY DEVICE IMPLEMENTING METHOD OF TESTING UFS INTERFACE

(71) Applicant: Samsung Electronics Co., Ltd., Suwon-si, Gyeonggi-do (KR)

(72) Inventors: Ha-Neul Jeong, Suwon-si (KR); Woo-Seong Cheong, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 207 days.

(21) Appl. No.: 13/647,415

(22) Filed: Oct. 9, 2012

(65) Prior Publication Data
US 2013/0097460 A1    Apr. 18, 2013

(30) Foreign Application Priority Data
Oct. 18, 2011  (KR) .................. 10-2011-0106635

(51) Int. Cl.
| | | |
|---|---|---|
| G06F 11/00 | (2006.01) | |
| G11C 29/02 | (2006.01) | |
| G06F 11/22 | (2006.01) | |
| G11C 29/56 | (2006.01) | |

(52) U.S. Cl.
CPC ............ *G11C 29/022* (2013.01); *G06F 11/221* (2013.01); *G11C 2029/5602* (2013.01)

(58) Field of Classification Search
CPC .......................... G06F 11/263; G06F 11/277
USPC ......................................................... 714/32
See application file for complete search history.

(56) References Cited

U.S. PATENT DOCUMENTS

| | | | |
|---|---|---|---|
| 5,640,509 A | | 6/1997 | Balmer et al. |
| 6,671,836 B1 * | | 12/2003 | Lai et al. ...................... 714/718 |
| 7,111,208 B2 * | | 9/2006 | Hoang et al. .................. 714/716 |
| 2005/0262336 A1 * | | 11/2005 | Cherukuri et al. ................ 713/2 |
| 2010/0049465 A1 * | | 2/2010 | Pineda De Gyvez et al. 702/122 |
| 2010/0177811 A1 * | | 7/2010 | Duerdodt et al. ............. 375/224 |

(Continued)

FOREIGN PATENT DOCUMENTS

| | | |
|---|---|---|
| JP | 08-262116 | 11/1996 |
| JP | 11-053897 | 2/1999 |
| KR | 1020000011182 | 2/2000 |

OTHER PUBLICATIONS

UniPro Controller IP Core, 2009, Arasan Chip Systems, Inc., Version 1.2a.*

(Continued)

*Primary Examiner* — Scott Baderman
*Assistant Examiner* — Paul Contino
(74) *Attorney, Agent, or Firm* — Volentine & Whitt, PLLC

(57) ABSTRACT

A method is provided for performing a self-test on a memory device in a test mode, where the memory device includes a universal flash storage (UFS) link layer and a UFS physical layer having a transmitting unit and a receiving unit. The method includes generating a first signal; sending the first signal from a test unit through the UFS link layer to the transmitting unit in the UFS physical layer to be transmitted to the receiving unit; receiving a second signal at the test unit from the receiving unit in the UFS physical layer through the UFS link layer, the second signal being the first signal received by the receiving unit; and testing an operation performed by at least one of the UFS physical layer and the UFS link layer based on the first signal and the second signal.

32 Claims, 20 Drawing Sheets

(56) References Cited

U.S. PATENT DOCUMENTS

2011/0072185 A1* 3/2011 Pinto et al. .................. 710/315
2011/0138096 A1* 6/2011 Radulescu et al. ............ 710/305

OTHER PUBLICATIONS

Scherzinger, Roland. Electrical-, protocol- and application layer validation of MIPI D-PHY and M-PHY designs. May 12, 2009 [retrieved on Jun. 18, 2014]. Retrieved from the Internet <URL: http://www.home.agilent.com/upload/cmc_upload/All/Electrical-protocol-and-application-layer-validation-MIPI-D-PHY-and-M-PHY-desi.pdf?&cc=US&lc=eng>.*
Keller, Perry, The How to Guide to UFS, Jun. 15, 2011, JEDEC.*
Woolk, David. New MIPI Standards, Part 2: UniPro. EDN Network. Jul. 8, 2011 [retrieved on Jun. 18, 2014]. Retrieved from the Internet <URL: http://www.edn.com/electronics-blogs/testing-the-limits/4378032/New-MIPI-Standards-Part-2-UniPro>.*
Woolk, David. New MIPI Standards, Part 1: M-PHY. EDN Network. Jul. 1, 2011 [retrieved on Jun. 18, 2014]. Retrieved from the Internet <URL: http://www.edn.com/electronics-blogs/testing-the-limits/4378029/New-MIPI-Standards-Part-1-M-PHY>.*
Enabling MIPI Physical Layer Test High Speed Test and Characterization, Jul. 2008, Agilent Technologies.*
Galataki, Despo, Design and Verification of UniPro Protocols for Mobile Phones, Jul. 2009.*
Chung, Yuping, UFS PHY & UniPro, Oct. 12, 2011, JEDEC.*
Physical Layer Specifications. MIPI Alliance. Aug. 22, 2011 [retrieved on Jun. 23, 2014]. Retrieved from the Internet <URL:https://web.archive.org/web/20110822021407/http://mipi.org/specifications/physical-layer>.*
Frenzel, Louis E. Test the DigRF Interface on Mobile Internet Devices. Electronic Design. Nov. 8, 2008 [retrieved on Jul. 7, 2014]. Retrieved from the Internet <URL: http://electronicdesign.com/4g/test-digrf-interface-mobile-internet-devices>.*
Lee, Jack, MIPI D-PHY Interface Test, Jun. 9, 2010, Teradyne.*

* cited by examiner

METHOD OF TESTING UNIVERSAL FLASH STORAGE (UFS) INTERFACE AND MEMORY DEVICE IMPLEMENTING METHOD OF TESTING UFS INTERFACE

CROSS-REFERENCE TO RELATED APPLICATIONS

A claim of priority under 35 U.S.C. §119 is made to Korean Patent Application No. 10-2011-0106635, filed on Oct. 18, 2011, in the Korean Intellectual Property Office, the entire contents of which are hereby incorporated by reference.

BACKGROUND

The inventive concept relates to methods of testing a universal flash storage (UFS) interface, and memory devices performing the tests of a UFS interface using the methods, and more particularly, where the test is performed at low cost and quickly adapts to changing technologies.

In order for a host and a device to communicate, a link or lane connecting the host and the device is formed and data is transmitted or received through the link or lane. Thus, a test is performed to check whether the link or lane is normally formed between the host and the device, and whether data is normally transmitted and received through the link or lane.

SUMMARY

Embodiments of the inventive concept provide methods of testing a universal flash storage (UFS) interface and memory devices performing tests using the method, where the test is performed at low cost and quickly adapts to changing technologies.

According to an aspect of the inventive concept, a method of performing a self-test on a memory device in a test mode is provided, where the memory device includes a universal flash storage (UFS) link layer and a UFS physical layer having a transmitting unit and a receiving unit. The method includes generating a first signal; sending the first signal from a test unit through the UFS link layer to the transmitting unit in the UFS physical layer to be transmitted to the receiving unit; receiving a second signal at the test unit from the receiving unit in the UFS physical layer through the UFS link layer, the second signal being the first signal received by the receiving unit; and testing an operation performed by at least one of the UFS physical layer and the UFS link layer based on the first signal and the second signal.

According to another aspect of the inventive concept, a memory device having self-test capability in a test mode includes a universal flash storage (UFS) physical layer, a UFS link layer and a test unit. The UFS physical layer includes a transmitting unit configured to output a first signal and a receiving unit configured to receive the first signal via a loop-back line (LBL) as a second signal, according to UFS protocol. The UFS link layer is configured to pass the first signal to the transmitting unit and to pass the second signal from the receiving unit, according to the UFS protocol. The test unit is configured to test whether the UFS physical layer and the UFS link layer normally operate according to the UFS protocol by generating and transmitting the first signal to the UFS link layer and receiving the second signal from the UFS link layer.

According to another aspect of the inventive concept, a memory device having self-test capability includes a UFS physical layer, a UFS translator layer, a UFS link layer and a test unit. The UFS physical layer includes a transmitting unit configured to output a first signal and a receiving unit configured to receive the first signal via an LBL as a second signal. The UFS translator layer is for at least one of adding predetermined information relating to the first signal to a header of the first signal, and detecting predetermined information relating to the second signal in a header of the second signal. The UFS link layer is configured to pass the first signal from the UFS translator layer to the transmitting unit in the UFS physical layer and to pass the second signal from the receiving unit in the UFS physical layer to the UFS translator layer. The test unit is configured to test whether the UFS physical layer and the UFS link layer normally operate according to UFS protocol by generating and transmitting the first signal to the UFS translator layer and receiving the second signal and the detected predetermined information relating to the second signal from the UFS translator layer.

According to another aspect of the inventive concept, a test unit is coupled to a UFS link layer and a UFS physical layer of a memory device, the UFS physical layer including a transmitting unit configured to output a first signal and a receiving unit configured to receive the first signal via an LBL as a second signal. The test unit includes a flow control unit, a host control unit, and a target control unit. The flow control unit is configured to receive a test mode signal indicating one of a host mode or a target mode for a testing an operation of the memory device, and to generate a first arbitration signal in the host mode and a second arbitration signal in the target mode in response to the test mode signal, where the test unit operates as a host device external to the memory device in the host mode and operates as the memory device in the target mode. The host control unit is for at least one of generating the first signal as a host signal and receiving the second signal as the host signal in the host mode, in response to the first arbitration signal. The target control unit is for at least one of generating the first signal as a target signal and receiving the second signal as the target signal in the target mode, in response to the second arbitration signal. The test unit is configured to transmit the first signal to the UFS link layer in one of the host mode and the target mode, and to receive the second signal from the UFS link layer in one of the host mode and the target mode, the UFS link layer passing the first and second signals between the test unit and the UFS physical layer, to test whether the UFS link layer and the UFS physical layer normally operate according to UFS protocol based on the first and second signals.

According to another aspect of the inventive concept, there is provided a memory device including a UFS physical layer, a UFS link layer and a test unit. The UFS physical layer includes a transmitting unit that outputs a first signal and a receiving unit that receives the first signal as a second signal according to a UFS protocol, in a test mode. The UFS link layer is for transmitting the first signal to the transmitting unit and receiving the second signal from the receiving unit according to the UFS protocol. The test unit is for testing whether the UFS physical layer and the UFS link layer normally operate according to the UFS protocol by generating and transmitting the first signal to the UFS link layer and receiving the second signal from the UFS link layer.

The test unit may include a test operation unit for generating the first signal and receiving the second signal in a host mode in response to a first arbitration signal, or generating the first signal and receiving the second signal in a target mode in response to a second arbitration signal. The test unit may further include a flow control unit for generating the first arbitration signal in the host mode and generating the second arbitration signal in the target mode, and transmitting the first and second arbitration signals to the test operation unit.

The test operation unit may include a host control unit that is activated in response to the first arbitration signal, generating the first signal as a host signal and receiving the second signal as the host signal in the host mode. The test operation unit may further include a target control unit that is activated in response to the second arbitration signal, generating the first signal as a target signal and receiving the second signal as the target signal in the target mode.

The host signal may be a signal playing roles as a host device communicable with the memory device, and the target signal may be a signal playing roles as the memory device.

The test unit may perform a test on a lane control operation of the UFS physical layer and UFS link layer as the target control unit receives the first signal constituting the host signal generated by the host control unit as the second signal constituting the target signal, or as the host control unit receives the first signal constituting the target signal generated by the target control unit as the second signal constituting the host signal.

The target control unit may be activated in response to the second arbitration signal to generate the first signal as a lane discovery standby notice signal constituting the target signal. The host control unit may be activated in response to the first arbitration signal and may perform a lane discovery operation by receiving the lane discovery standby notice signal as the second signal constituting the host signal, and generate the first signal as a lane discovery complete signal constituting the host signal.

The target control unit may end a lane discovery standby by receiving the lane discovery complete signal as the second signal constituting the target signal, and generating a lane realignment standby notice signal constituting the target signal as the first signal. The host control unit may perform a lane realignment operation by receiving the lane realignment standby notice signal as the second signal constituting the host signal, and generating the first signal as a lane realignment complete signal constituting the host signal.

The target control unit may end a lane realignment standby by receiving the lane realignment complete signal as the second signal constituting the target signal, and generating a lane termination standby notice signal constituting the target signal as the first signal. The host control unit may perform a lane termination operation by receiving the lane termination standby notice signal as the second signal constituting the host signal. The test unit may generate a test result that tests whether lane control of the UFS physical layer and the UFS link layer are successful, when the generating of the first signal and receiving of the second signal are sequentially performed.

The test operation unit may further include an initialization control unit for performing tests on reset of the UFS physical layer and the UFS link layer, as the target control unit receives the first signal constituting the host signal generated by the host control unit as the second signal constituting the target signal, or as the host control unit receives the first signal constituting the target signal generated by the target control unit as the second signal constituting the host signal.

The host control unit may be activated in response to the first arbitration signal, and control the initialization control unit to generate the first signal as a host reset signal constituting the host signal. The target control unit may be activated in response to the second arbitration signal, and generate the first signal as a target reset signal constituting the target signal by receiving the host reset signal as the second signal constituting the target signal. The test unit may generate a test result that tests whether lane control of the UFS physical layer and the UFS link layer are successful, when the generating of the first signal and receiving of the second signal are sequentially performed.

The target control unit may be activated in response to the second arbitration signal, and control the initialization control unit to generate the first signal as a target reset signal constituting the target signal, and the host control unit may be activated in response to the first arbitration signal, and generate the first signal as a host reset signal constituting the host signal by receiving the target reset signal as the second signal constituting the host signal.

The test operation unit may further include a message control unit for performing a test on data transmission and reception of the UFS physical layer and the UFS link layer, as the target control unit receives the first signal constituting the host signal generated by the host control unit as the second signal constituting the target signal, or as the host control unit receives the first signal constituting the target signal generated by the target control unit as the second signal constituting the host signal.

The host control unit may be activated in response to the first arbitration signal, and control the message control unit to generate the first signal as a host data signal constituting the host signal, and the target control unit may be activated in response to the second arbitration signal, receive the host data signal as the second signal constituting the target signal, and compare the first and second signals. Alternatively, the target control unit may be activated in response to the second arbitration signal, and control the message control unit to generate the first signal as a target data signal constituting the target signal, and the host control unit may be activated in response to the first arbitration signal, receive the target data signal as the second signal constituting the host signal, and compare the first and second signals. The test unit may generate a test result that tests whether data transmission and reception of the UFS physical layer and the UFS link layer are successful, when the first and second signals are identical.

The memory device may further include a UFS translator layer for adding predetermined information to the first signal generated as the target signal and transmitting the first signal to the UFS link layer, or for analyzing information included in the second signal constituting the target signal from the UFS link layer and transmitting the information to the test unit.

At least one of the UFS physical layer, the UFS link layer, and the test unit may be included in a controller of the memory device. The memory device may be a memory card or a solid state drive (SSD). The UFS physical layer may be a mobile industry processor interface (MIPI) M-Phy and the UFS link layer may be a MIPI Unipro, for example. According to other aspects of the inventive concept, the memory provided may be provided in a computer system.

BRIEF DESCRIPTION OF THE DRAWINGS

Exemplary embodiments will be more clearly understood from the following detailed description taken in conjunction with the accompanying drawings, in which.

DETAILED DESCRIPTION OF THE EMBODIMENTS

Figure 1:
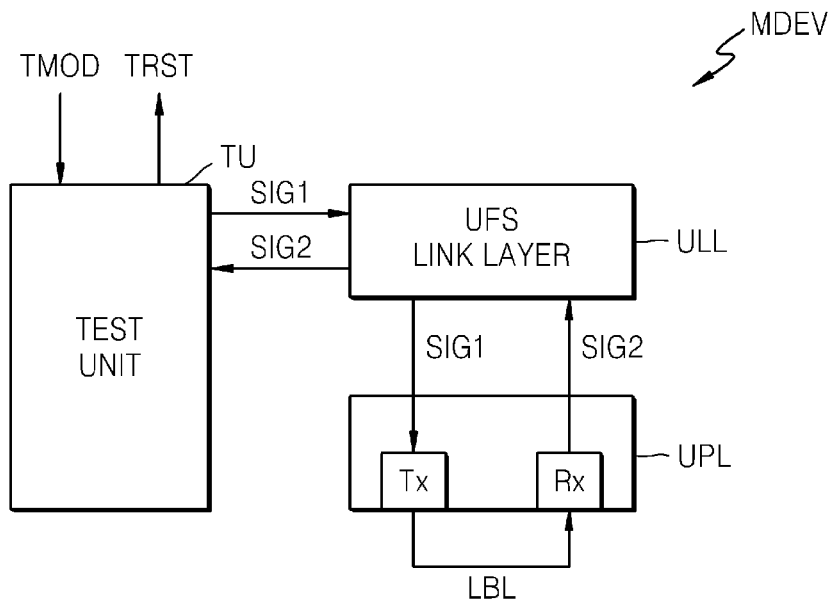
FIG. 1 is a block diagram of a memory device, according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, expressions such as "at least one of," when preceding a list of elements, modify the entire list of elements and do not modify the individual elements of the list.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Embodiments of the inventive concept are described herein with reference to schematic illustrations of idealized embodiments (and intermediate structures) of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing.

Figure 2:
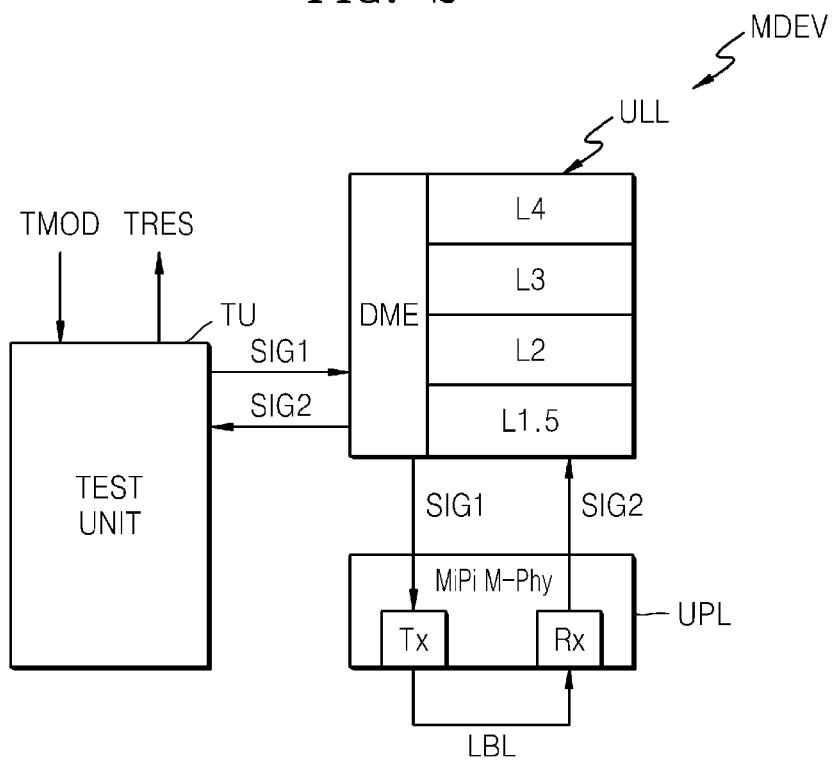
FIG. 2 is a block diagram showing a universal flash storage (UFS) link layer and a UFS physical layer of FIG. 1, according to an embodiment of the inventive concept.

FIGS. 1 and 2 are block diagrams of a memory device MDEV, according to embodiments of the inventive concept.

Referring to FIG. 1, the memory device MDEV includes a universal flash storage (UFS) link layer ULL, a UFS physical layer UPL, and a test unit TU. The UFS link layer ULL converts a first signal SIG1 and a second signal SIG2 according to a UFS protocol, and the UFS physical layer UPL outputs (transmits) the first signal SIG1 and receives the second signal SIG2 according to the UFS protocol. The UFS protocol is a standard providing a common interface for various flash memories.

As shown in FIG. 2, the UFS link layer ULL may be implemented as mobile industry processor interface (MIPI) Unipro, and the UFS physical layer UPL may be implemented as MIPI M-phy, for example. MIPI Unipro is a communication protocol capable of supporting fast communication speeds using fewer lines. The MIPI Unipro may be realized by a physical adaptor layer L1.5, a data link layer L2, a network layer L3, a transaction layer L4, and device management entity (DME) that controls the physical adaptor layer L1.5, the data link layer L2, the network layer L3, and the transaction layer L4. The layers of MIPI Unipro sequentially convert a signal into forms of a segment, a packet, and a frame, or into forms of a frame, a packet, and a segment, for example. A header may be added to or removed from the first and second signals SIG1 and SIG2, according to converting operations between the layers as the first and second signals SIG1 and SIG2 pass through the layers. However, for ease of explanation, the first and second signals SIG1 and SIG2 are referred to by the same name regardless of the state of conversion.

Figure 3:
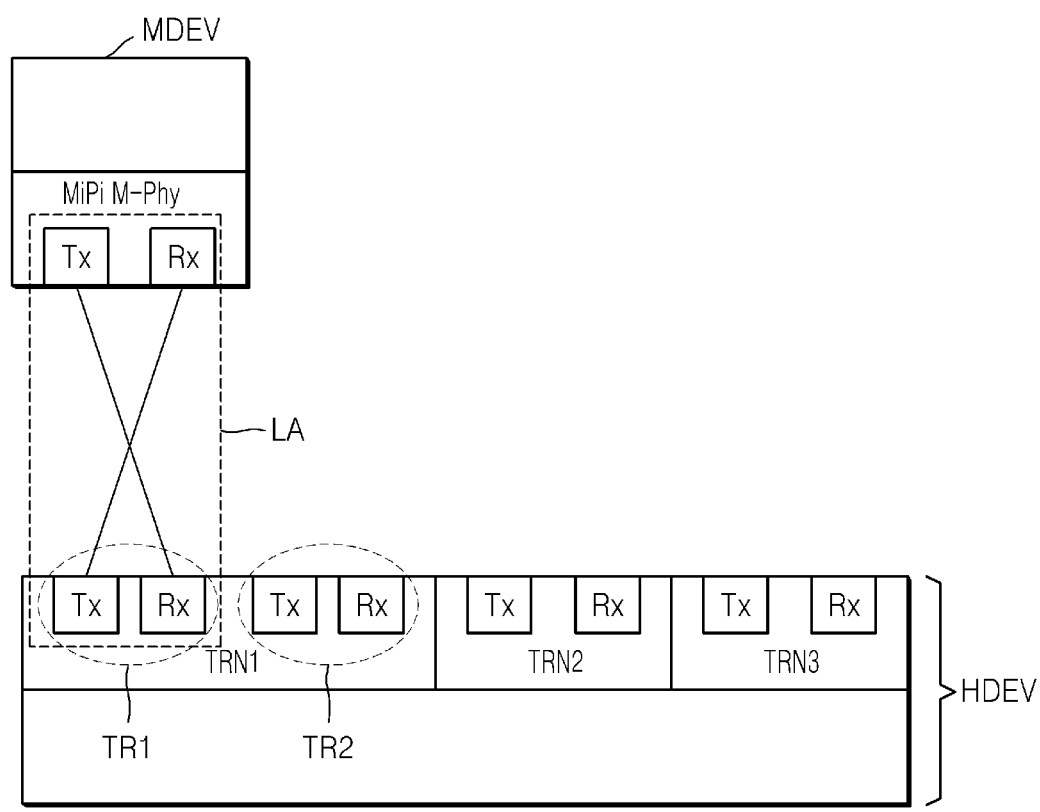
FIG. 3 is a block diagram showing a lane formed between a memory device and a host device, according to an embodiment of the inventive concept.

FIG. 3 is a block diagram showing a lane formed between a memory device and a host device, according to an embodiment of the inventive concept.

Referring to FIG. 3, MIPI M-phy forms a lane LA with an external host device HDEV. The memory device MDEV, according to an embodiment, transmits and receives a signal to and from the external host device HDEV through the lane LA. The host device HDEV includes representative first through third communication terminals TRN1 through TRN3 for each connected device. For example, the first communication terminal TRN1 of the host device HDEV may be assigned to the memory device MDEV.

Each of the first through third communication terminals TRN1 through TRN3 of the host device HDEV includes at least one pair of a transmitting unit Tx and a receiving unit Rx to transmit and receive signals to and from connected devices. For example, the first communication terminal TRN1 of the host device HDEV connected to the memory device MDEV includes two pairs TR1 and TR2 of a transmitting unit Tx and a receiving unit Rx. When a connection between the host device HDEV and the memory device MDEV is initiated, the MIPI M-phy of FIG. 2 may be connected to the pair TR1 or the pair TR2 of the first communication terminal TRN1 of the host device HDEV.

A channel formed to transmit and receive signals to and from the host device HDEV and the memory device MDEV may be referred to as a lane. For example, referring to FIG. 3, the transmitting unit Tx and the receiving unit Rx of the MIPI M-phy of the memory device MEDV are connected to the transmitting unit Tx and the receiving unit Rx of the pair TR1 of the first communication terminal TRN1 of the host device HDEV to form the lane LA.

Referring again to FIG. 1, the UFS link layer ULL and the UFS physical layer UPL interface data transmission and reception between the memory device MEDV and a host device, such as the host device HDEV. An example of the host device is provided by the host device HDEV of FIG. 5. In other words, a host device described hereinafter may be the host device HDEV of FIG. 5. The UFS link layer ULL and the UFS physical layer UPL may convert application data having a bit value transmitted from a processor (not shown) of the memory device MDEV to an electric signal transmittable to the host device HDEV through the lane LA of FIG. 3, or may convert an electric signal received from the host device HDEV to application data having a bit value usable in the processor of the memory device MDEV.

In order to transmit and receive a signal (or data) to and from the host device HDEV, the UFS link layer ULL and the UFS physical layer UPL first reset, e.g., when the memory device MDEV is powered on, and perform a lane control operation on a lane, such as a link start-up operation. The reset is an operation that includes initiating the UFS link layer ULL and the UFS physical layer UPL of the memory device MDEV to communicate with the host device HDEV. The lane control operation includes forming and controlling the lane LA shown in FIG. 3, for example, for the memory device MDEV to communicate with the host device HDEV. The lane control operation may include at least one of a lane discovery operation, a lane realignment operation, and a lane termination operation. When a lane is formed or changed (e.g., realigned) for communication with the host device HDEV, the data is transmitted and received to and from the host device HDEV through the formed or changed lane.

Accordingly, while testing whether communication between the memory device MDEV and the host device HDEV is normally performed, the reset of the UFS link layer ULL and UFS physical layer UPL, as well as the lane control operation and the data transmitting and receiving operation of the UFS link layer ULL and the UFS physical layer UPL need to be tested.

Referring again to FIG. 1, the test unit TU included in the memory device MDEV performs a test on at least one operation from among the reset of the UFS link layer ULL and the UFS physical layer UPL, the lane control operation, and the data transmitting and receiving operation of the UFS link layer ULL and the UFS physical layer UPL. Accordingly, the test unit TU tests whether the UFS physical layer UPL and the UFS link layer ULL normally perform the above operations by generating and transmitting the first signal SIG1 sent to the UFS link layer ULL and receiving the second signal SIG2 from the UFS link layer ULL in a test mode. The test unit TU generates and outputs a test result TRST indicating test results.

Figure 4:
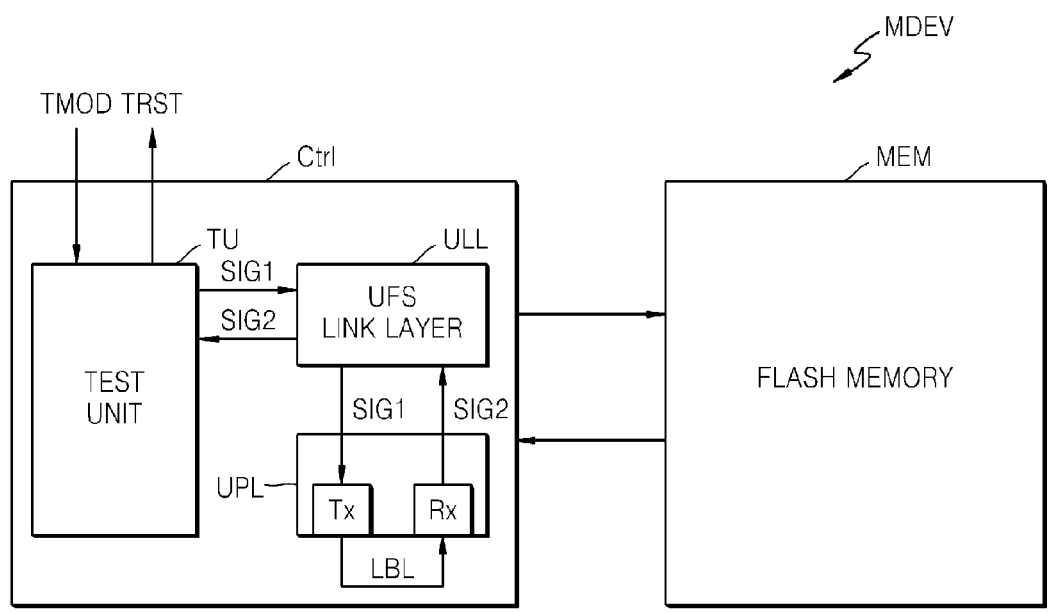
FIG. 4 is a block diagram of a memory device, according to an embodiment of the inventive concept.

The test unit TU, the UFS link layer ULL, and the UFS physical layer UPL may be included in a memory controller Ctrl of the memory device MDEV, for example, as shown in FIG. 4. The memory controller Ctrl of the memory device MDEV controls data to be programmed to or read from representative flash memory MEM. Alternatively, the test unit TU may be included in the memory MEM.

Figure 5:
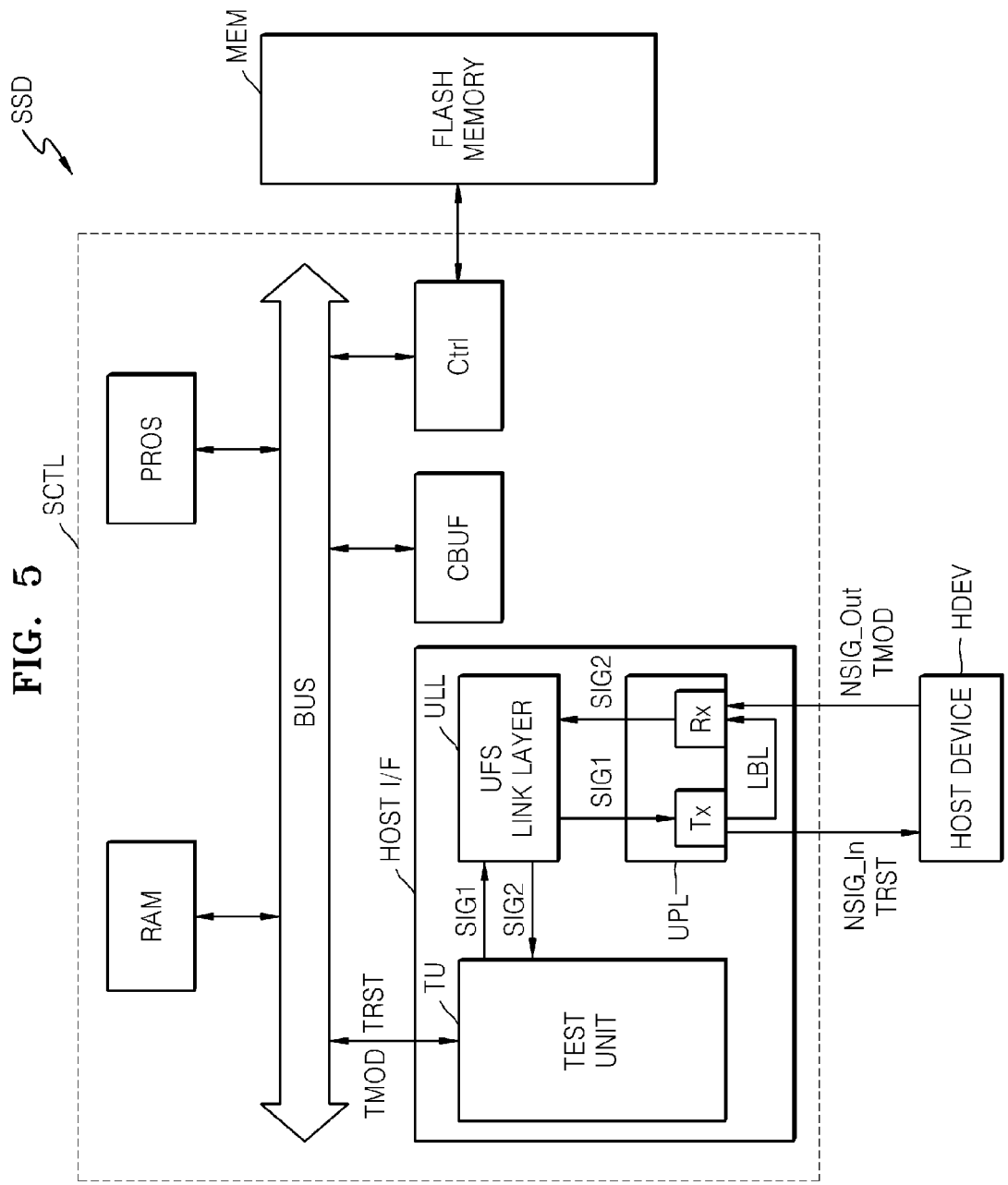
FIG. 5 is a block diagram of a solid state drive (SSD) as the memory device of FIG. 1, according to an embodiment of the inventive concept.

Alternatively, if the memory device MDEV is realized by a solid state drive (SSD) as shown in FIG. 5, the test unit TU may be included in a host interface HOST I/F—, along with the UFS link layer ULL and the UFS physical layer UPL. Alternatively, the test unit TU may be realized as a functional block separate from the host interface HOST I/F including the UFS link layer ULL and the UFS physical layer UPL.

The SSD of FIG. 5 includes SSD controller SCTL and memory MEM, and the host interface HOST I/F may be included in the SSD controller SCTL. The host interface HOST I/F transmits a request of the host device HDEV or a process result of the SSD according to the request to the host device HDEV. Generally, the host interface HOST I/F interfaces with the host device HDEV using any of various interface protocols, such as universal serial bus (USB), multimedia card (MMC), peripheral component interconnect-express (PCI-E), serial advanced technology attachment (SATA), parallel advanced technology attachment (PATA), small computer system interface (SCSI), enhanced small device interface (ESD), and intelligent drive electronics (IDE), for example. The host interface HOST I/F may specifically interface with the host device HDEV using the UFS protocol as described above.

The test unit TU may be activated in a test mode. In other words, the test unit TU may test whether the reset operation, the lane control operation, and/or the data transmitting and receiving operation is performed normally in the UFS link layer ULL and the UFS physical layer UPL in the test mode. The test unit TU enters the test mode in response to receiving a test mode signal TMOD. A test operation performed by the test unit TU will be described in detail below.

The test mode signal TMOD may be externally received and the test result TRST of the test unit TU may be externally transmitted. A user testing the memory device MDEV may check the test mode signal TMOD and the test result TRST through a separate interface device (not shown). Alternatively, a processor PROS may transmit the test mode signal TMOD to the test unit TU and receive the test result TRST via a bus BUS.

In the depicted embodiment, the processor PROS is included in the SSD controller SCTL, along with the host interface HOST I/F. Moreover, the SSD controller SCTL further includes random access memory (RAM), a cache buffer (CBUF), and a memory controller Ctrl that are connected to the host interface HOST I/F and the processor PROS through the bus BUS. When the test unit TU of FIG. 5 is deactivated, i.e., when the memory device MDEV operates in a normal mode instead of the test mode, the processor PROS of the SSD controller SCTL controls the SSD to operate according to a request NSIG_In of the host device HDEV received through the receiving unit Rx of the UFS physical layer UPL of the host interface HOST I/F. Also, the processor PROS controls the SSD to transmit a process result NSIG_Out of the SSD regarding the request NSIG_In of the host device HDEV to the host device HDEV through the transmitting unit Tx of the UFS physical layer UPL.

Here, data required to operate the processor PROS may be loaded in the RAM. Also, data to be transmitted to the memory MEM or received from the memory MEM may be temporarily stored in the cache buffer CBUF. The cache buffer CBUF may be a static RAM (SRAM), for example. Also, the processor PROS and the memory controller Ctrl of the SSD may be realized by one ARM processor, for example.

FIG. 5 shows the memory device MDEV realized as an SSD, but the embodiments are not limited to this configuration. Various examples of realizing the memory device MDEV will be described in detail below.

The test operation of the memory device MDEV, according to an embodiment, will now be described in detail.

Referring again to FIG. 1, in the memory device MDEV, the first signal SIG1 generated by the test unit TU is output to the transmitting unit Tx of the UFS physical layer UPL. The first signal SIG1 output from the transmitting unit Tx of the UFS physical layer UPL is looped back to the receiving unit Rx of the UFS physical layer UPL. The memory device MDEV may further include a loop-back line LBL connecting the transmitting unit Tx and the receiving unit Rx of the UFS physical layer UPL to enable the loop-back of the first signal SIG1 from the transmitting unit Tx to the receiving unit Rx of the UFS physical layer UPL. In the depicted embodiment, the first signal SIG1 looped back from the transmitting unit Tx to the receiving unit Rx of the UFS physical layer UPL is referred to as the second signal SIG2.

Figure 6:
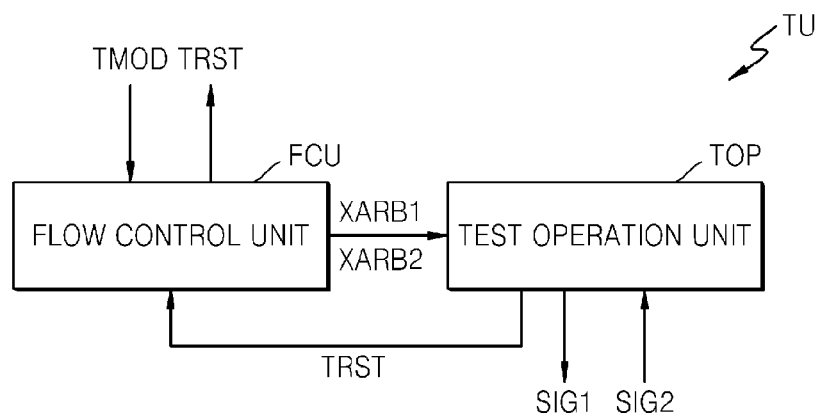
FIG. 6 is a block diagram of a test unit of FIG. 1, according to an embodiment of the inventive concept.

FIG. 6 is a block diagram of the test unit TU of FIG. 1, according to an embodiment of the inventive concept.

Referring to FIGS. 1 and 6, the test unit TU includes a flow control unit FCU and a test operation unit TOP. The flow control unit FCU receives the test mode signal TMOD, indicating a host mode or a target mode. In response, the flow control unit FCU generates first arbitration signal XARB1 in the host mode and second arbitration signal XARB2 in the target mode for controlling the test operation unit TOP, accordingly. When the flow control unit FCU transmits the first arbitration signal XARB1 to the test operation unit TOP, the test operation unit TOP generates the first signal SIG1 in the host mode and receives the second signal SIG2 in the host mode. Alternatively, when the flow control unit FCU transmits the second arbitration signal XARB2 to the test operation unit TOP, the test operation unit TOP generates the first signal SIG1 in the target mode and receives the second signal SIG2 in the target mode. The flow control unit FCU may be implemented by a state machine, for example, to perform a mode switch corresponding to the generating of the first signal SIG1 and the receiving of the second signal SIG2.

As mentioned above, the test operation unit TOP generates the first signal SIG1 and receives the second signal SIG2 in the host mode or the target mode, in response to the first arbitration signal XARB1 or the second arbitration signal XARB2, respectively. The test operation unit TOP may also generate the test result TRST based on whether the generating of the first signal SIG1 and the receiving of the second signal SIG2 are normally performed, and may transmit the test result TRST to the flow control unit FCU, which may transmit the test result TRST to the processor PROS or the like, as described above. Alternatively, the test operation unit TOP may transmit the first and second signals SIG1 and SIG2 to the flow control unit FCU, and the flow control unit FCU may generate and output the test result TRST according to the first and second signals SIG1 and SIG2. Test operations in the memory device MDEV will be described regardless of whether the test result TRST is transmitted from the test operation unit TOP to the flow control unit FCU or the first and second signals SIG1 and SIG2 are transmitted from the test operation unit TOP to the flow control unit FCU.

In the host mode, the test unit TU operates as the host device HDEV that controls the memory device MDEV, and in the target mode, the test unit TU operates as the memory device MDEV. The first and second signals SIG1 and SIG2 in the host mode are signals operated on in the host device HDEV generated by the test unit TU, whereas the first and second signals SIG1 and SIG2 in the target mode are signals operated on in the memory device MDEV generated by the test unit TU. Details about the first and second signals SIG1 and SIG2 will be described in detail below.

Figure 7:
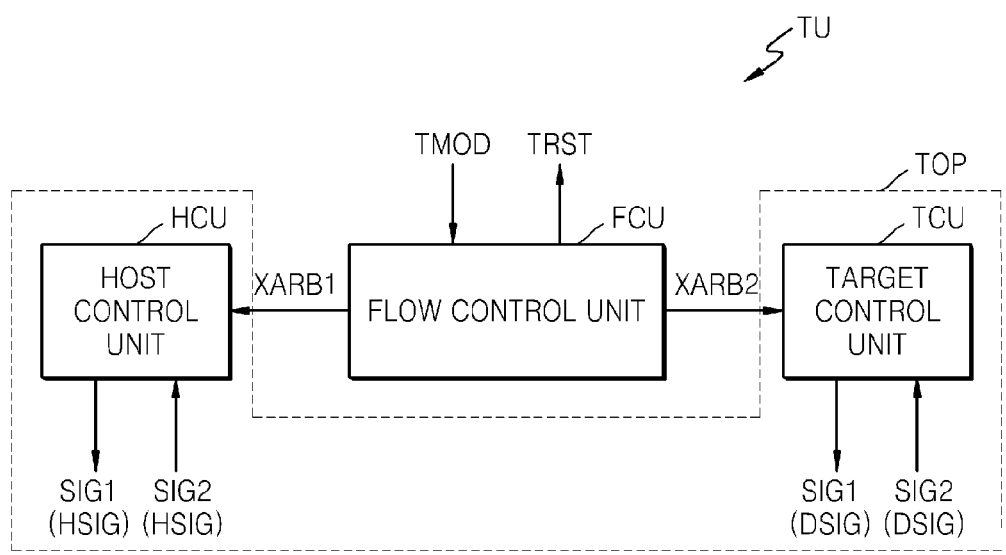
FIG. 7 is a block diagram of a test operation unit of FIG. 6, according to an embodiment of the inventive concept.

FIG. 7 is a block diagram of the test operation unit TOP of FIG. 6, according to an embodiment of the inventive concept.

Referring to FIG. 7, the test operation unit TOP according to the depicted embodiment includes a host control unit HCU and a target control unit TCU. The host control unit HCU generates the first signal SIG1 and receives the second signal SIG2 in the host mode, in response to the first arbitration signal XARB1. The host control unit HCU may include a command set realized in the host device HDEV. The command set may be stored in a register (not shown). Accordingly, the first signal SIG1 generated by the host control unit HCU and the second signal SIG2 received by the host control unit HCU may be a host signal HSIG operated on in the host device HDEV. In other words, the host control unit HCU generates or receives the first or second signal SIG1 or SIG2, which is the host signal HSIG, to operate as the host device HDEV, so that the memory device MDEV simulates communication with the host device HDEV without being connected to the host device HDEV.

The target control unit TCU generates the first signal SIG1 and receives the second signal SIG2 in the target mode, in response to the second arbitration signal XARB2. The target control unit TCU may include a command set realized in the memory device MDEV. The command set may be stored in a register (not shown). Accordingly, the first signal SIG1 generated by the target control unit TCU and the second signal SIG2 received by the target control unit TCU may be a target signal DSIG operated on in the memory device MDEV.

Figure 8:
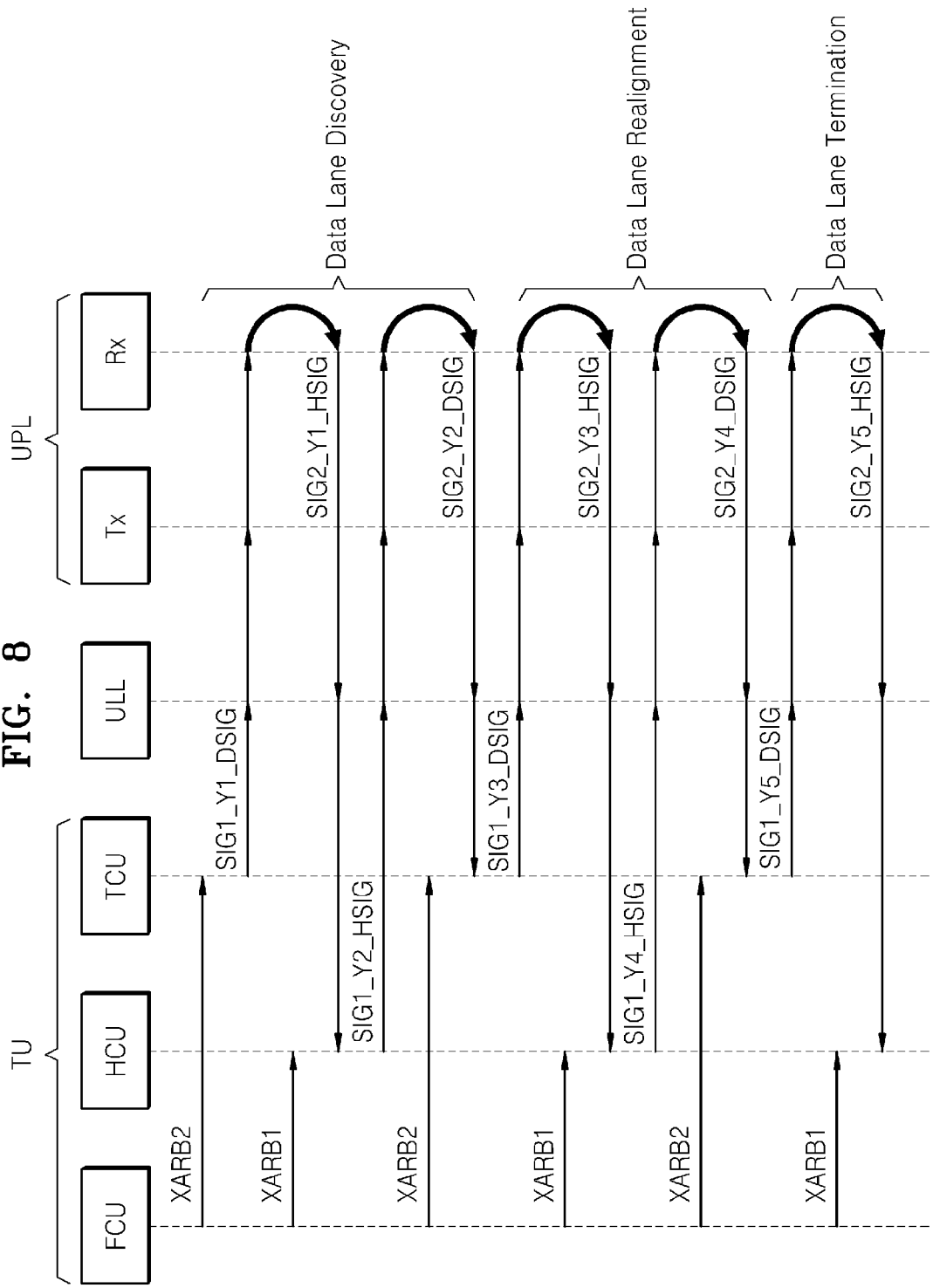
FIG. 8 is a flow diagram for describing a method of testing a lane control operation in a memory device, according to an embodiment of the inventive concept.

FIG. 8 is a signal flow diagram for describing a method of testing a lane control operation in a memory device, according to an embodiment of the inventive concept. More specifically, in FIG. 8, the lane control operation includes a data lane discovery operation, a lane realignment operation, and a lane termination operation. However, the lane control operation is not limited to including all these operations, and may include alternative or additional operations. Hereinafter, the method of FIG. 8 will be described with reference to the illustrative test unit TU shown in FIG. 7. However, the method may be performed by test units according to other embodiments, without departing from the scope of the present teachings.

Referring to FIGS. 7 and 8, the test unit TU first tests the data lane discovery operation, so as to test the lane control operation. The data lane discovery operation initiates a lane, such as the lane LA of FIG. 3, as the memory device MDEV and the host device HDEV exchange information about an activated lane. In order to perform the data lane discovery operation, the flow control unit FCU transmits the second arbitration signal XARB2 to the target control unit TCU. The target control unit TCU generates the first signal SIG1 in response to the second arbitration signal XARB2, which is a target signal DSIG. Here, the signal generated by the target control unit TCU as the first signal SIG1 for the data lane discovery operation may be a lane discovery standby notice signal SIG1_Y1_DSIG for notifying the host that the memory device MDEV is standing by for lane discovery. The lane discovery standby notice signal SIG1_Y1_DSIG may include information about the activated lane in the memory device MDEV. The target control unit TCU may include a register (not shown) for storing the information about the activated lane.

In FIG. 8, a reference symbol of the target signal DSIG is included in a reference symbol of the lane discovery standby notice signal SIG1_Y1_DSIG to show that the lane discovery standby notice signal SIG1_Y1_DSIG is a signal in the target mode, i.e., the target signal DSIG operated on in the memory device MDEV. Generally, reference symbols of signals show whether they are a target signal DSIG or a host signal HSIG.

The lane discovery standby notice signal SIG1_Y1_DSIG generated by the target control signal TCU is transmitted to the UFS link layer ULL. The UFS link layer ULL sends the lane discovery standby notice signal SIG1_Y1_DSIG to the transmitting unit Tx of the UFS physical layer UPL by sequentially converting the lane discovery standby notice signal SIG1_Y1_DSIG to forms of segments, packets, and frames.

The transmitting unit Tx of the UFS physical layer UPL converts the lane discovery standby notice signal SIG1_Y1_DSIG in the form of frames to an electric signal, and outputs the electric signal. The lane discovery standby notice signal SIG1_Y1_DSIG output from the transmitting unit Tx of the UFS physical layer UPL is received by the receiving unit Rx of the UFS physical layer UPL through the loop-back line LBL of FIG. 1. As described above, a signal received by the receiving unit Rx of the UFS physical layer UPL through the loop-back line LBL in the test mode, where the test unit TU is activated, is called the second signal SIG2. A lane discovery standby notice signal SIG2_Y1_HSIG constituting the electric signal received by the receiving unit Rx of the UFS physical layer UPL is sent to the test unit TU through the UFS link layer ULL after being sequentially converted to forms of frames, packets, and segments. Since converting operations in the UFS link layer ULL and UFS physical layer UPL are the same as those described above, details about the converting operations in the UFS link layer ULL and UFS physical layer UPL will not be repeated while describing the signal flow of the first and second signals SIG1 and SIG2.

In the depicted embodiment, the lane discovery standby notice signal SIG2_Y1_HSIG is a host signal HSIG because the flow control unit FCU switches the operation mode of the test unit TU at the same time or before the second signal SIG2 is received by the receiving unit Rx of the UFS physical layer UPL. For example, the flow control unit FCU may switch the operation mode from the target mode to the host mode before the receiving unit Rx of the UFS physical layer UPL receives the lane discovery standby notice signal SIG2_Y1_HSIG as the second signal SIG2. The flow control unit FCU may include a timer (not shown) to switch the operation mode between the target mode and the host mode. Here, the timer may perform a timing operation on an average time for the first signal SIG1 to be output from the test unit TU to the transmitting unit Tx of the UFS physical layer UPL. Alternatively, the flow control unit FCU may switch the operation mode by receiving information about the first signal SIG1 being output from the transmitting unit Tx of the UFS physical layer UPL, but embodiments of the inventive concept are not limited thereto. The flow control unit FCU may switch the operation mode by being synchronized with the receiving of the second signal SIG2 by the receiving unit Rx of the UFS physical layer UPL or the test unit TU.

Referring again to FIGS. 7 and 8, in order to switch from the target mode to the host mode, the flow control unit FCU transmits the first arbitration signal XARB1 to the host control unit HCU. Accordingly, the lane discovery standby notice signal SIG2_Y1_HSIG constituting the second signal SIG2 is transmitted to the host control unit HCU. The host control unit HCU generates a lane discovery complete signal SIG1_Y2_HSIG as the first signal SIG1, in response to the lane discovery standby notice signal SIG2_Y1_HSIG constituting the second signal SIG2. The lane discovery complete signal SIG1_Y2_HSIG notifies the memory device MDEV that the lane discovery operation is performed after the host device HDEV performed the lane discovery operation in response to a lane discovery request of the memory device MDEV. Here, information about a formed lane (for example, information about which lane is used to connect the host device HDEV and the memory device MDEV) may be stored in a register (not shown) of the host control unit HCU.

When the lane discovery complete signal SIG1_Y2_HSIG constituting the host signal HSIG is output from the transmitting unit Tx of the UFS physical layer UPL, the lane discovery complete signal SIG1_Y2_HSIG is received by the receiving unit Rx of the UFS physical layer UPL as the second signal SIG2 constituting the target signal DSIG. As described above, the flow control unit FCU switches the operation mode of the test operation unit TOP from the host mode to the target mode before or at the same time the second signal SIG2 is received by the receiving unit Rx of the UFS physical layer UPL. Thus, the target control unit TCU receives a lane discovery complete signal SIG2_Y2_DSIG as the second signal SIG2, in response to the second arbitration signal XARB2 transmitted from the flow control unit FCU to the target control unit TCU.

As such, the lane for communication between a memory device and a host device is initialized. For example, in the memory device MDEV, the lane LA is activated with respect to the host device HDEV, as shown in FIG. 3, and the host device HDEV is aware that the lane LA is activated with respect to the memory device MDEV. Thus, the memory device MDEV and the host device HDEV are able to exchange data through the lane LA. The target control unit TCU and the host control unit HCU may each store information about an activated lane in a register.

Referring again to FIGS. 7 and 8, the lane realignment operation is performed when the target control unit TCU receives the lane discovery complete signal SIG2_Y2_DSIG as the second signal SIG2. The lane realignment operation is performed to check information about the lane and to update lane information if the lane has changed, since a state of the lane formed between the memory device MDEV and the host device HDEV may be changed. For example, the lane LA of FIG. 3 formed between the memory device MDEV and the transmission unit Tx and the receiving unit Rx of the pair TR1 of the first communication terminal TRN1 of the host device HDEV may be switched to the transmitting unit Tx and the receiving unit Rx of the pair TR2 of the first communication terminal TRN1 of the host device HDEV, and the lane realignment operation is performed to provide information required to transmit and receive signals between the memory device MDEV and the host device HDEV through the changed lane. In other words, the lane realignment operation is performed to check whether information about the lane formed between the memory device MDEV and the host device HDEV has changed via the lane discovery operation, and if the information has changed, to update the information. In the above illustrative embodiment, if communication cannot be performed through a first lane formed via the lane discovery operation, the lane realignment operation may be performed such that the communication is performed between the host device HDEV and the memory device MDEV through a new second lane.

The target control unit TCU generates a lane realignment standby notice signal SIG1_Y3_DSIG as the first signal SIG1 constituting the target signal DSIG to check whether the lane realignment operation is normally performed in the memory device MDEV. The lane realignment standby notice signal SIG1_Y3_DSIG includes the information about the lane formed via the lane discovery operation. The lane realignment standby notice signal SIG1_Y3_DSIG constituting the first signal SIG1 is converted in the UFS link layer ULL and output through the transmitting unit Tx of the UFS physical layer UPL. The receiving unit Rx of the UFS physical layer UPL receives the lane realignment standby notice signal SIG1_Y3_DSIG as the second signal SIG2 in the host mode, and the lane realignment standby notice signal SIG2_Y3_HSIG constituting the second signal SIG2 is converted in the UFS link layer ULL and received by the host control unit HCU.

More particularly, the flow control unit FCU switches the operation mode of the test operation unit TOP from the target mode to the host mode before or at the same time the second signal SIG2 is received by the receiving unit Rx of the UFS physical layer UPL. Thus, the host control unit HCU is activated in response to the first arbitration signal XARB1, receives the lane realignment standby notice signal SIG2_Y3_HSIG as the second signal SIG2, and generates a lane realignment complete signal SIG1_Y4_HSIG as the first signal SIG1 constituting the host signal HSIG. The lane realignment complete signal SIG1_Y4_HSIG may include lane information according to the lane realignment operation between the host device HDEV and the memory device MDEV. Here, the lane information checked through the lane realignment operation may be stored in a register (not shown) of the host control unit HCU. The lane information according to the lane realignment operation may be identical to or newly updated from previous lane information.

The lane realignment complete signal SIG1_Y4_HSIG constituting the host signal HSIG is output as the first signal SIG1 through the transmitting unit Tx of the UFS physical layer UPL, and the receiving unit Rx of the UFS physical layer UPL receives a lane realignment complete signal SIG2_Y4_DSIG as the second signal SIG2 in the target mode, constituting the target signal DSIG.

Upon receiving the lane realignment complete signal SIG2_Y4_DSIG as the second signal SIG2, the target control unit TCU generates a lane termination standby notice signal SIG1_Y5_DSIG as the first signal SIG1 constituting the target signal DSIG. The lane termination standby notice signal SIG1_Y5_DSIG constituting the target signal DSIG is output as the first signal SIG1 through the transmitting unit Tx of the UFS physical layer UPL, and the receiving unit Rx of the UFS physical layer UPL receives a lane termination standby signal SIG2_Y5_HSIG as the second signal SIG2 in the host mode, constituting the host signal HSIG. The host control unit HCU receives the lane termination standby notice signal SIG2_Y5_HSIG as the second signal SIG2 constituting the host signal HSIG. The lane termination operation breaks the lane between the host device HDEV and the memory device MDEV during power-off.

When the generating of the first signal SIG1 and the receiving of the second signal SIG2 are sequentially performed, the test result TRST may show that the lane control operation in the UFS physical layer UPL and the UFS link layer ULL succeeded.

The lane control operation may be performed when the UFS link layer ULL is reset. As described above, the resetting of the UFS link layer ULL may be performed when the memory device MDEV is turned on, for example. The lane control operation of FIG. 8 may be performed when the UFS link layer ULL according to an embodiment is reset. Alternatively, the lane control operation of FIG. 8 may be performed after the UFS link layer ULL is reset by the host control unit HCU and the target control unit TCU of FIG. 7.

Figure 9:
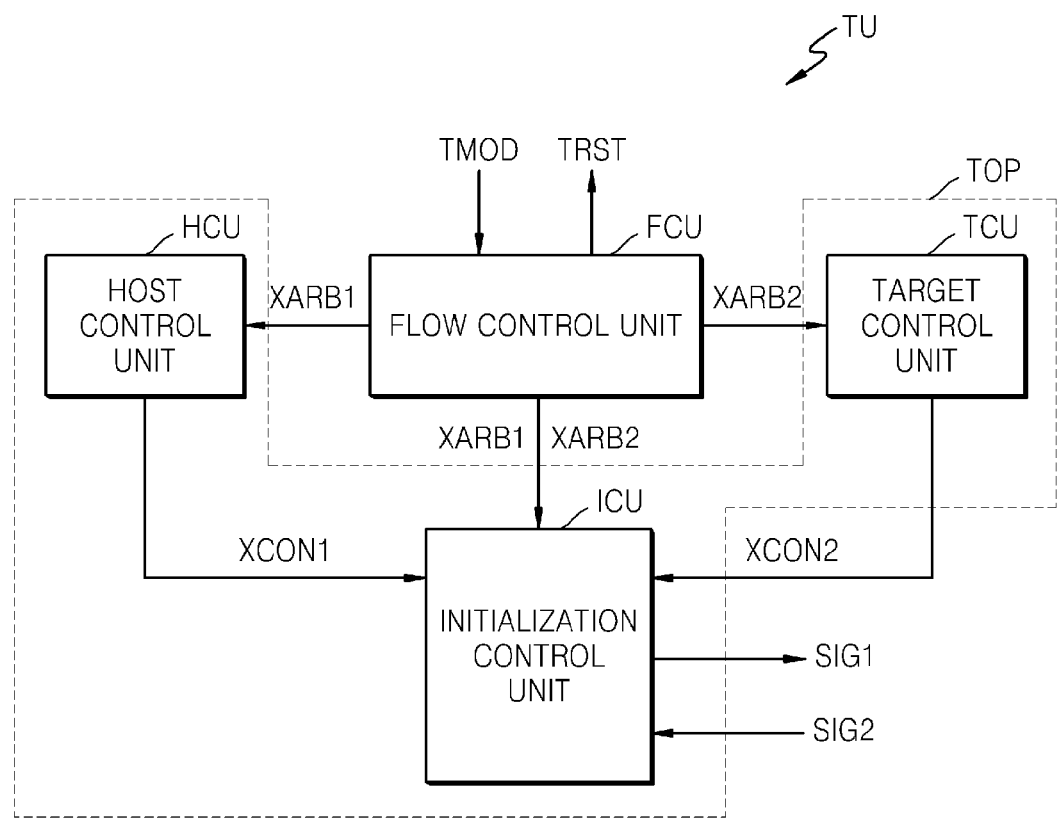
FIG. 9 is a block diagram of the test operation unit of FIG. 6, according to another embodiment of the inventive concept.
Figure 10:
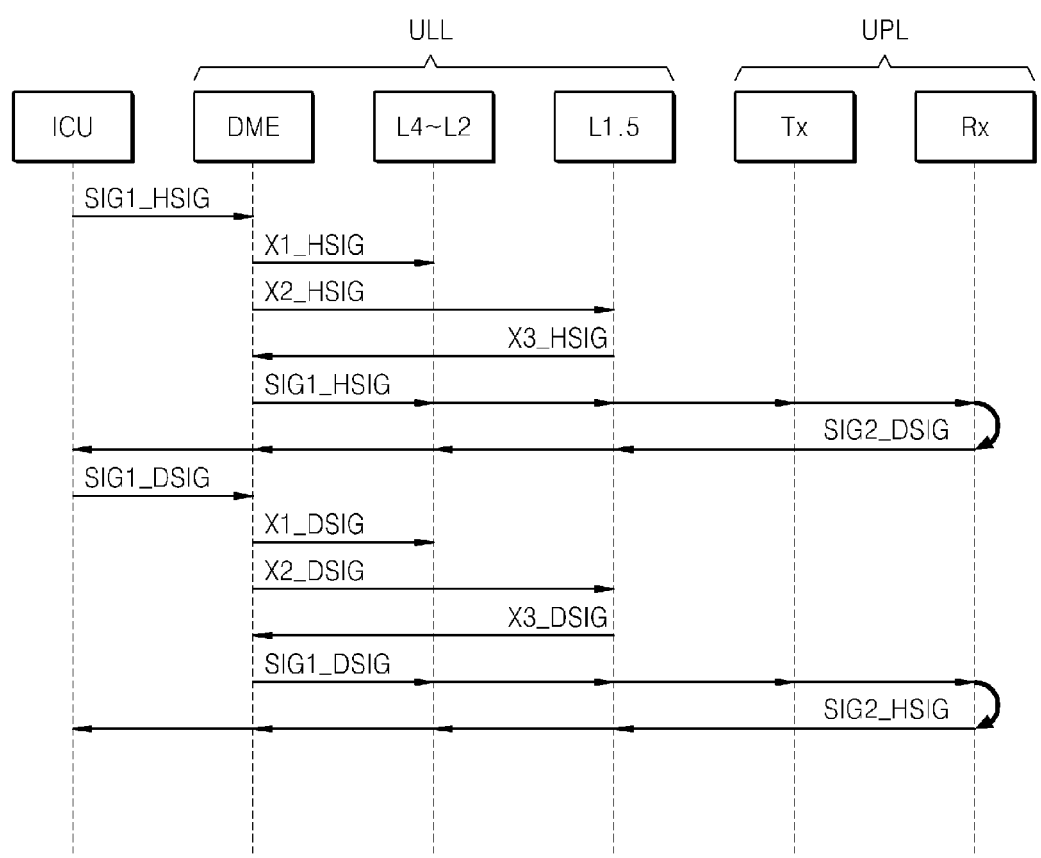
FIGS. 10 and 11 are flow diagrams showing operations of an initialization control unit of FIG. 9, according to embodiments of the inventive concept.

FIG. 9 is a functional block diagram of the test unit TU of FIGS. 6 and 7, according to an embodiment of the inventive concept. The test unit TU further includes an initialization control unit ICU for testing a reset operation, along with the host control unit HCU and the target control unit TCU, so that the UFS link layer ULL is reset by the initialization control unit ICU before the lane control operation of FIG. 8. FIG. 10 is a signal flow diagram for describing a method of testing a reset operation in a memory device, according to an embodiment of the inventive concept.

Referring to FIGS. 9 and 10, the initialization control unit ICU of the test unit TU according to the depicted embodiment receives a first control signal XCON1 from the host control unit HCU, which is activated in response to the first arbitration signal XARB1 from the flow control unit FCU. The initialization control unit ICU generates the first signal SIG1 as a host reset signal SIG1_HSIG constituting the host signal HSIG in response to the first control signal XCON1, and sends the host reset signal SIG1_HSIG to the UFS link layer ULL. In response to the host reset signal SIG1_HSIG, the DME of the UFS link layer ULL transmits host layer reset signals X1_HSIG and X2_HSIG requesting reset to the layers L4 through L2 and to layer L1.5, respectively, of the UFS link layer ULL. In FIG. 10, the same host layer reset signal X1_HSIG is transmitted to each of the layers L2 through L4 of FIG. 4, but this is only for convenience of illustration, and different host layer reset signals may be transmitted to the layers L2 through L4, respectively.

The layers L1.5 through L4 perform the reset operation in response to the corresponding host layer reset signals X1_HSIG and X2_HSIG. When the reset operation is completed, the layer L1.5 transmits a host reset complete signal X3_HSIG to the DME. In response to the host reset complete signal X3_HSIG, the DME sends the host reset signal SIG1_HSIG constituting the first signal SIG1 to the transmitting unit Tx of the UFS physical layer UPL, which transmits the host reset signal SIG1_HSIG. The receiving unit Rx of the UFS physical layer UPL receives the host reset signal SIG1_HSIG output from the transmitting unit Tx of the UFS physical layer UPL as the target reset signal SIG2_DSIG constituting the second signal SIG2. Here, the test operation unit TOP transmits a second control signal XCON2 to the initialization control unit ICU, so that the second arbitration signal XARB2 for operating the memory device MDEV in the target mode is transmitted to the target control unit TCU, and the initialization control unit ICU processes the host reset signal SIG1_HISG as the target reset signal SIG2_DSIG.

Upon receiving the host reset signal SIG1_HSIG as the target reset signal SIG2_DSIG, the initialization control unit ICU generates the first signal SIG1 as a target reset signal SIG1_DSIG constituting the target signal DSIG, in response to the second control signal XCON2. The DME receives the target reset signal SIG1_DSIG from the initialization control unit ICU and transmits target layer reset signals X1_DSIG and X2_DSIG requesting reset to the layers L1.5 to L4 of the UFS link layer ULL, respectively, in response to the target reset signal SIG1_DSIG. In FIG. 10, the same target layer reset signal X1_DSIG is transmitted to each of the layers L2 through L4 of FIG. 2, but this is only for convenience of illustration, and different target layer reset signals may be transmitted to the layers L2 through L4, respectively.

The layers L1.5 through L4 perform the reset operation in response to the corresponding target layer reset signals X1_DSIG and X2_DSIG. When the reset operation is completed, the layer L1.5 transmits a target reset complete signal X3_DSIG to the DME, notifying that the reset operation is completed in response to the target layer reset signal X2_DSIG. In response to the target reset complete signal X3_DSIG, the DME sends the target reset signal SIG1_DSIG constituting the first signal SIG1 to the transmitting unit Tx of the UFS physical layer UPL, which transmits the target reset signal SIG1_DSIG. The receiving unit Rx of the UFS physical layer UPL receives the target reset signal SIG1_DSIG output from the transmitting unit Tx of the UFS physical layer UPL as the host reset signal SIG2_HSIG constituting the second signal SIG2.

When the generating of the first signal SIG1 and the receiving of the second signal SIG2 are normally performed, the initialization control unit ICU generates the test result TRST showing that the reset operation is normally performed.

Figure 11:
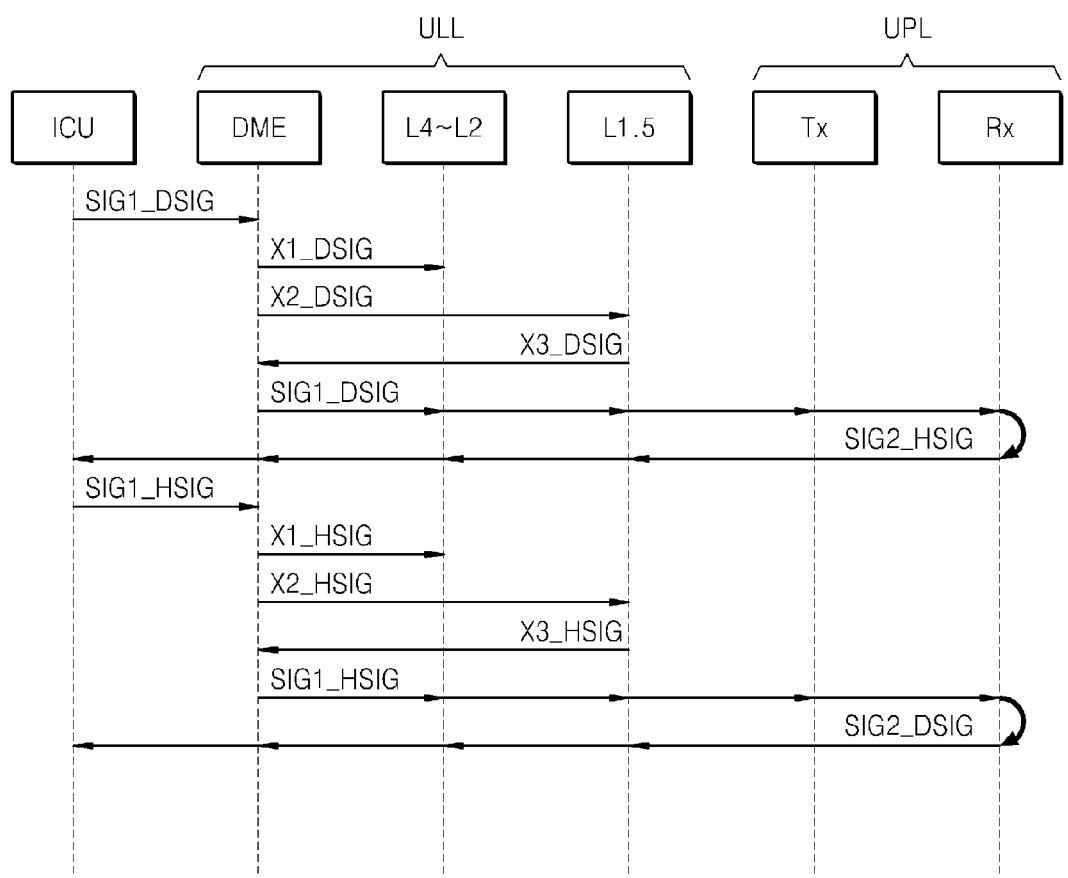

In FIG. 10, the target layer reset signal SIG1_DSIG is generated after the host reset signal SIG1_HSIG is generated, although the order in which target layer reset signal SIG1_DSIG and the host reset signal SIG1_HSIG are generated is not limited thereto. For example, the host reset signal SIG1_HSIG may be generated after the target layer reset signal SIG1_DSIG is generated as shown in FIG. 11, the description of which is otherwise substantially the same as the description of FIG. 10 and therefore will not be repeated. Alternatively, the flow control unit FCU may control only the target control unit TCU to perform the reset operation by setting that the host layer reset operation by the host control unit HCU is completed.

The host layer reset signals X1_HSIG and X2_HSIG and/or the target layer reset signals X1_DSIG and X2_DSIG of FIGS. 10 and 11 may be signals PA_LM_RESET.req, DL_LM_RESET.req, PA_LM_RESET.req, and T_LM_RESET.req, for example, requesting reset of the layers L1.5 through L4 in the UFS protocol. The host reset complete signal X3_HSIG and/or the target reset complete signal X3_DSIG transmitted from the layer L1.5 of FIGS. 10 and 11 may be signal PA_LM_RESET.cnf_L, for example, in the UFS protocol notifying that the reset on the UFS protocol is completed. Although not described with reference to FIGS. 10 and 11, according to the UFS protocol, when the DME receives the signal PA_LM_RESET.cnf_L, for example, it may transmit signal PA_LM_ENABLE_LAYER.req requesting activation of each layer to the layer L1.5. Upon receiving the signal PA_LM_ENABLE_LAYER.req, the layer L1.5 may transmit signal PA_LM_ENABLE_LAYER.cnf_L notifying activation to the DME. The link start-up operation described above with reference to FIG. 8, for example, may be performed after the DME receives the signal PA_LM_ENABLE_LAYER.cnf_L.

Figure 12:
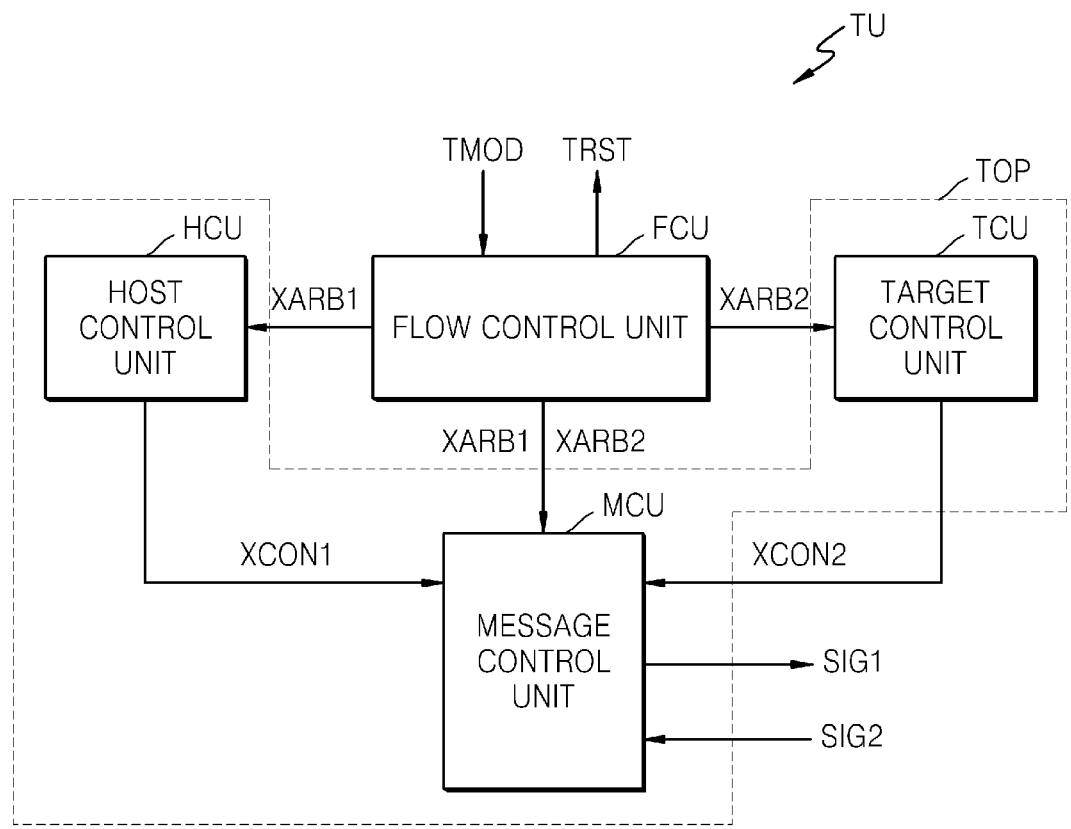
FIG. 12 is a block diagram of the test operation unit of FIG. 6, according to another embodiment of the inventive concept.
Figure 13:
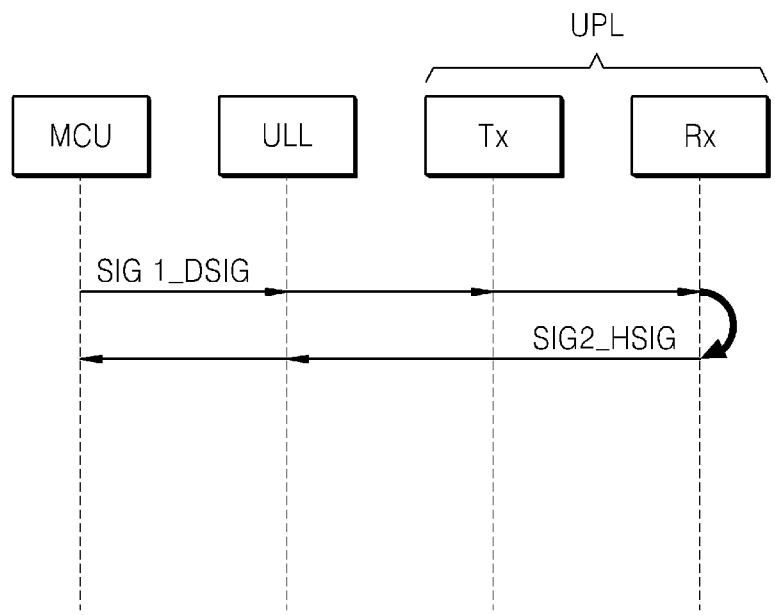
FIGS. 13 and 14 are flow diagrams showing operations of a message control unit of FIG. 12, according to embodiments of the inventive concept.
Figure 14:
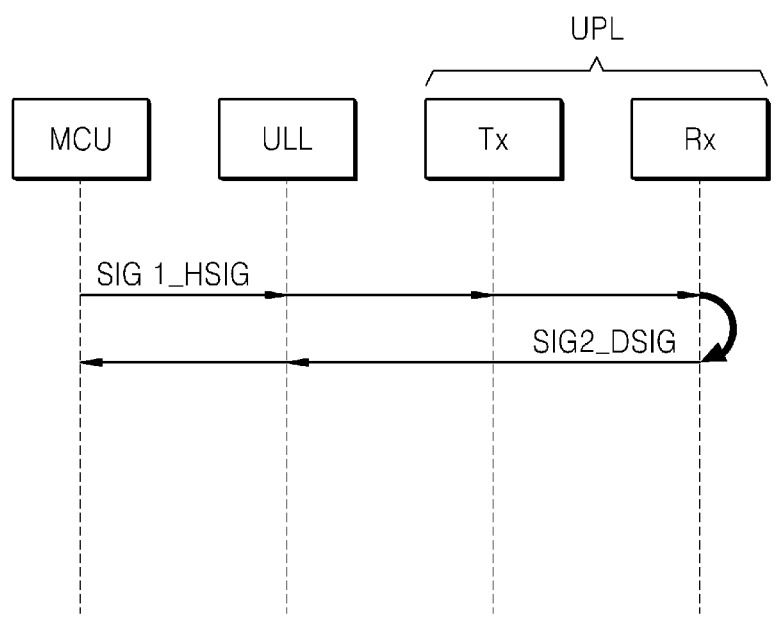

FIG. 12 is a functional block diagram of the test unit TU of FIGS. 6 and 7, according to an embodiment of the inventive concept. The test unit TU further includes an message control unit MCU for testing a data transmission and reception operation, along with the host control unit HCU and the target control unit TCU. FIGS. 13 and 14 are signal flow diagrams for describing methods of testing data transmission and reception in the test unit TU of FIG. 12, according to embodiments of the inventive concept.

Referring to FIGS. 1, 12, and 13, the message control unit MCU performs a test on data transmission and reception of the UFS physical layer UPL and the UFS link layer ULL. In particular, the message control unit MCU generates the first signal SIG1 as target data signal SIG1_DSIG constituting the target signal DSIG, in response to the second control signal XCON2. The second control signal XCON2 is generated by the target control unit TCU activated by the second arbitration signal XARB2.

When the target data signal SIG1_DSIG constituting the first signal SIG1 is output by the transmitting unit Tx of the UFS physical layer UPL, the receiving unit Rx of the UFS physical layer UPL receives the target data signal SIG1_DSIG as the second signal SIG2 constituting the host data signal SIG2_HSIG. The target data signal SIG1_DSIG received through the receiving unit Rx of the UFS physical layer UPL as host data signal SIG2_HSIG is transmitted to the message control unit MCU. The message control unit MCU compares the target data signal SIG1_DSIG as the first signal SIG1 and the host data signal SIG2_HSIG as the second signal SIG2 to test whether data provided by the memory device MDEV is normally transmittable to the host device HDEV.

Referring to FIGS. 1, 12, and 14, the message control unit MCU of the test unit TU generates the first signal SIG1 as the host data signal SIG1_HSIG constituting the host signal HSIG, in response to the first control signal XCON1. The first control signal XCON1 is generated by the host control unit HCU activated by the first arbitration signal XARB1. As described above, since the host control unit HCU is realized in a command set of the host device HDEV, the host control unit HCU may generate the first control signal XCON1 that controls the message control unit MCU to generate the host signal HSIG.

When the host data signal SIG1_HSIG constituting the first signal SIG1 is output through the transmitting unit Tx of the UFS physical layer UPL, the receiving unit Rx of the UFS physical layer UPL receives the host data signal SIG1_HSIG as the second signal SIG2 constituting target data signal SIG2_DSIG. The host data signal SIG1_HSIG received through the receiving unit Rx of the UFS physical layer UPL as the target data signal SIG2_DSIG is transmitted to the message control unit MCU. The message control unit MCU compares the host data signal SIG1_HSIG constituting the first signal SIG1 and the target data signal SIG2_DSIG constituting the second signal SIG2 to test whether data provided by the host device HDEV is normally transmittable in the memory device MDEV.

In the method of FIG. 13 or 14, when the generated first signal SIG1 and the received second signal SIG2 are identical, the test result TRST about the data transmission and reception of the UFS physical layer UPL and the UFS link layer ULL is generated as being successful.

Figure 15:
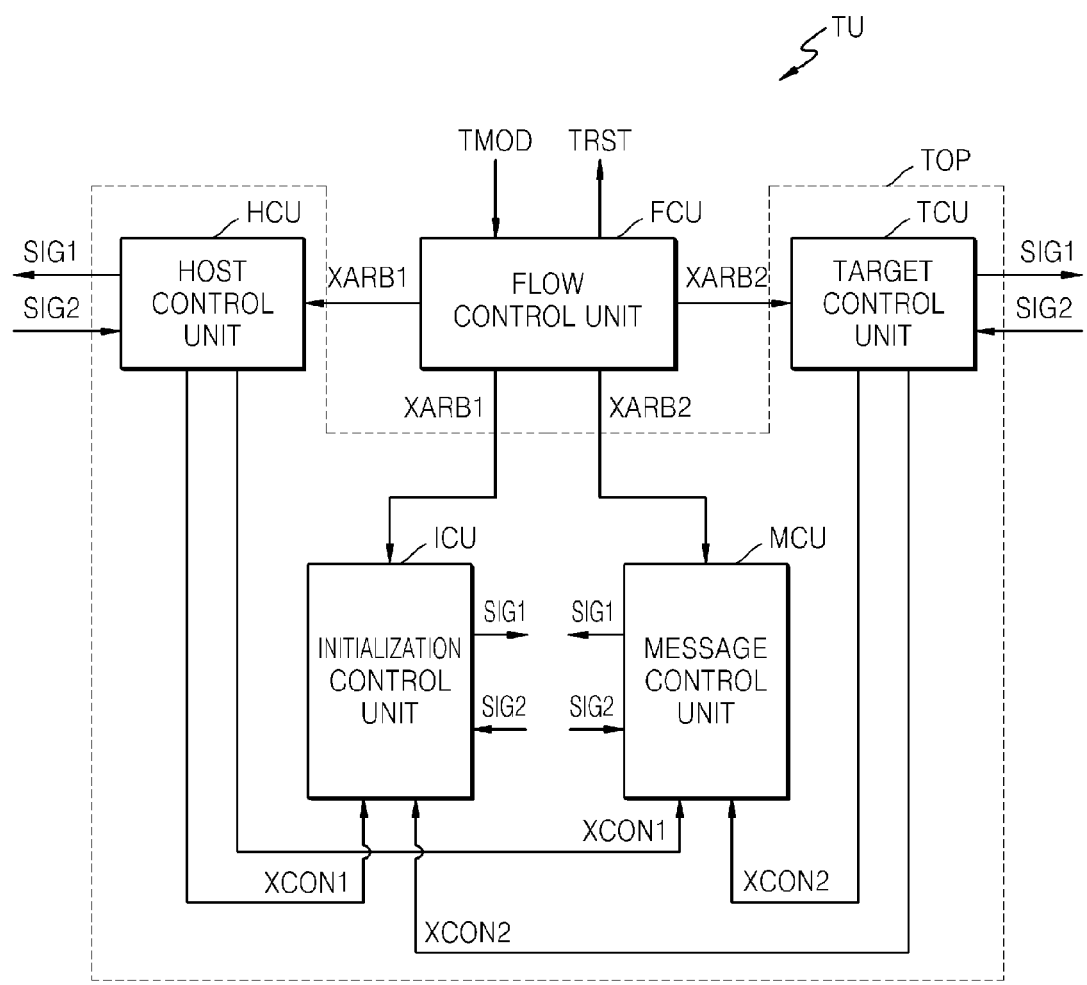
FIG. 15 is a block diagram of the test operation unit of FIG. 6, according to another embodiment of the inventive concept.

The test unit TU described above may include the initialization control unit ICU as shown in FIG. 9, or the message control unit MUC as shown in FIG. 12, but the test unit TU is not limited thereto. In other words, as shown in FIG. 15, the test unit TU may include both the initialization control unit ICU and the message control unit MCU. If the test unit TU includes both the initialization control unit ICU and the message control unit MCU, the initialization control unit ICU may perform the reset operation of FIG. 10 or 11 before the link start-up operation of FIG. 8 is performed, and the message control unit MCU may perform the message transmission and reception operation of FIG. 13 or 14 after the link start-up operation of FIG. 8 has ended, for example.

Figure 16:
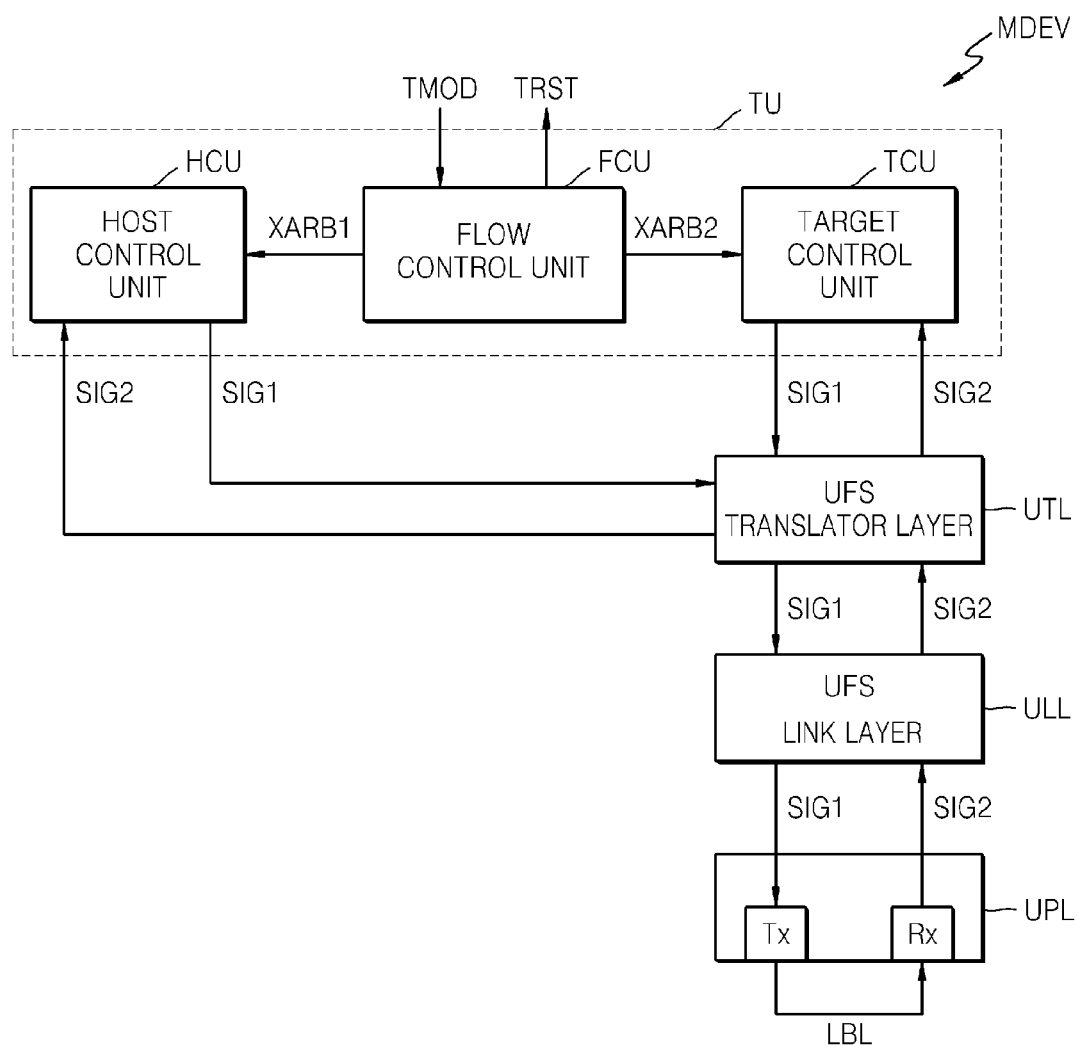
FIG. 16 is a block diagram of a memory device according to another embodiment of the inventive concept.

FIG. 16 is a functional block diagram of the memory device MDEV, according to another embodiment of the inventive concept.

Figure 17:
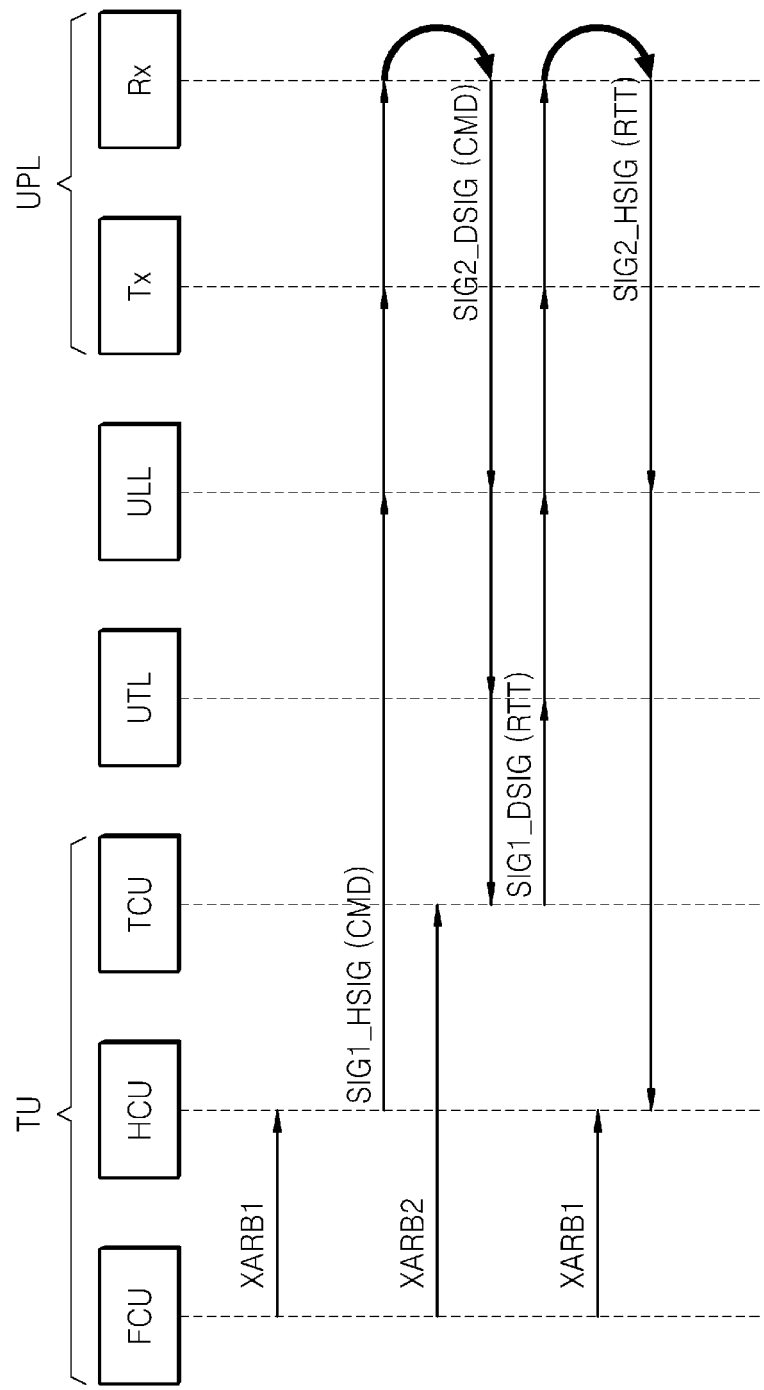
FIG. 17 is a flow diagram showing operations of the UFS translator layer of FIG. 16, according to an embodiment of the inventive concept.

Referring to FIG. 16, the memory device MDEV further includes a UFS translator layer UTL, e.g., as compared to the memory device MDEV of FIG. 1. FIG. 17 is a signal flow diagram for describing a method of utilizing the UFS translator layer UTL of FIG. 16, according to an embodiment of the inventive concept.

Generally, the UFS translator layer UTL may receive the first signal SIG1 constituting the target signal DSIG from the target control unit TCU of the test unit TU, add predetermined information to the first signal SIG1, and then transmit the first signal SIG1 with the predetermined information to the UFS link layer ULL. The UFS translator layer UTL may also receive the second signal SIG2 constituting the target signal DSIG from the UFS link layer ULL, analyze information included in the second signal SIG2 constituting the target signal DSIG, and transmit the analyzed information and/or the second signal SIG2 to the target control unit TCU of the test unit TU.

For example, referring to FIGS. 16 and 17, the host control unit HCU generates and sends first signal SIG1_HSIG(CMD) as the host signal HSIG, in response to first arbitration signal XARB1 in the host mode. The first signal SIG1_HSIG(CMD) is looped back to the target control unit TCU through the UFS physical layer UPL, the loop-back line LBL, the UFS link layer ULL and the UFS translation layer UTL. That is, the first signal SIG1_HSIG(CMD) generated as the host signal HSIG is received as a second signal SIG2_DSIG(CMD) constituting the target signal DSIG by the receiving unit Rx of the UFS physical layer UPL, and sent to the target control unit TCU through the UFS link layer ULL and the UFS translation layer UTL. The first signal SIG1_HSIG(CMD) may have a header that may include information about an OP code, data size to be written, or the like, by the host control unit HCU, for example. In this case, the UFS translator layer UTL may retrieve and decode the header information from the second signal SIG2_DISG(CMD) constituting the target signal DIG received from the UFS link layer ULL. The UFS translator layer UTL transmits the decoded information and/or the second signal SIG2_DSIG(CMD) to the target control unit TCU.

Meanwhile, the target control unit TCU also receives the second arbitration signal XARB2 from the flow control unit FCU. The target control unit TCU transmits the first signal SIG1_DSIG constituting the target signal DSIG to the UFS translator layer UTL in response to the second signal SIG2_DSIG(CMD) constituting the target signal DSIG. As mentioned above, when the second signal SIG2_DSIG (CMD) is a write command, for example, the UFS translator layer UTL may add information RTT about a data reception unit corresponding to the write command of the first signal SIG1_DSIG constituting the target signal DSIG to the header. The UFS translator layer UTL transmits a first signal SIG1_DSIG(RTT), including the information RTT, to the UFS link layer ULL. The first signal SIG1_DSIG(RTT) is looped back to the host control unit HCU through the UFS physical layer UPL, the loop-back line LBL, and the UFS link layer ULL as a second signal SIG2_HSIG(RTT). Accordingly, the first signal SIG1_DSIG generated as the target signal DSIG is received as the second signal SIG2_HSIG (RTT) constituting the host signal HSIG by the receiving unit Rx of the UFS physical layer UPL.

Although not shown in FIG. 17, the host control unit HCU may analyze the header of the second signal SIG2_HSIG (RTT) received through the UFS link layer ULL, and generate the first signal SIG1 constituting the host signal HSIG with data divided by sizes according to data reception units, for example. The host control unit HCU and the target control unit TCU are enabled under control of the flow control unit FCU, using the first and second arbitration signals XARB1 and XARB2, respectively, as described above.

Figure 18:
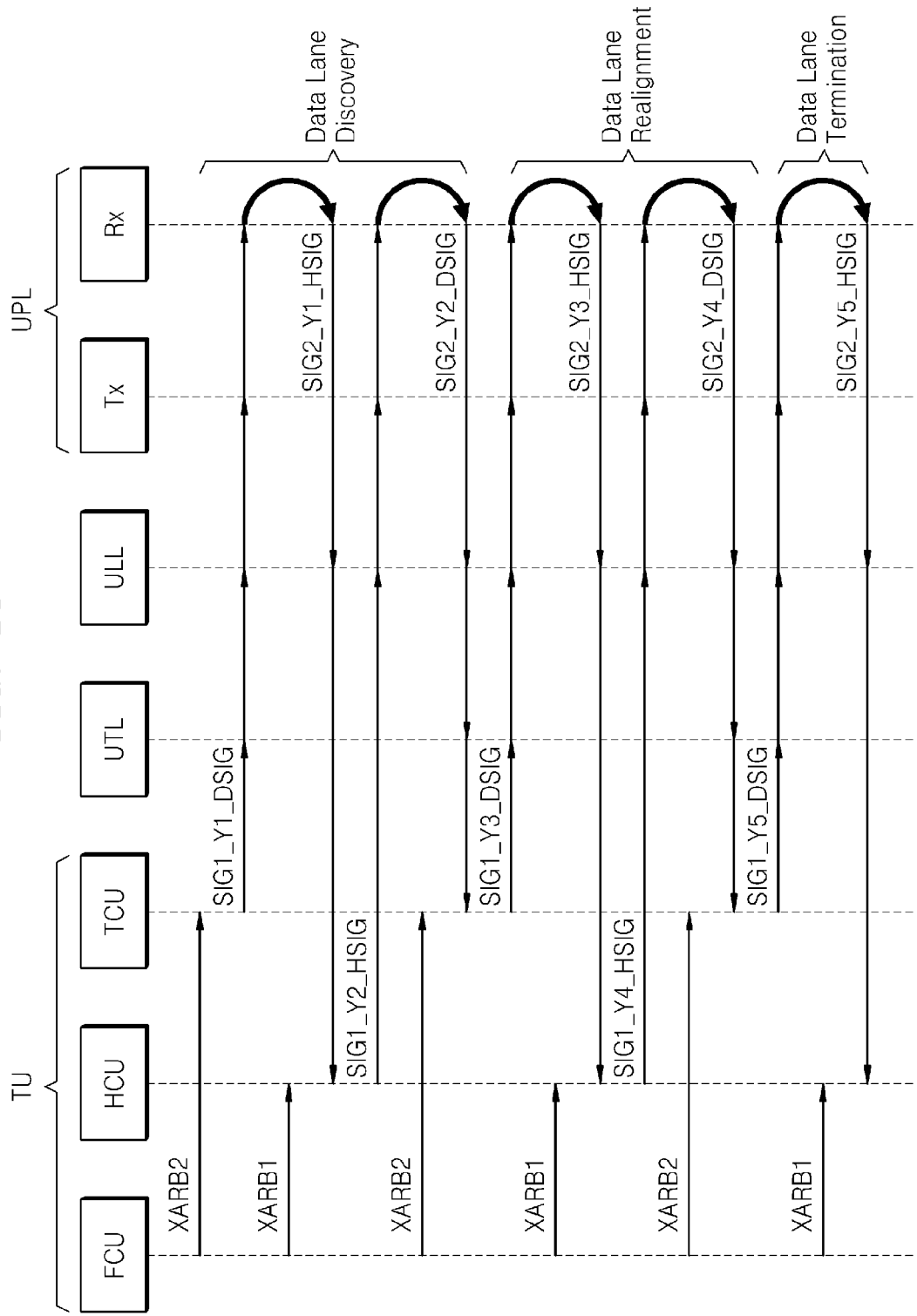
FIG. 18 is a flow diagram showing a lane control operation utilizing the UFS translator layer of FIG. 16, according to an embodiment of the inventive concept.
Figure 19:
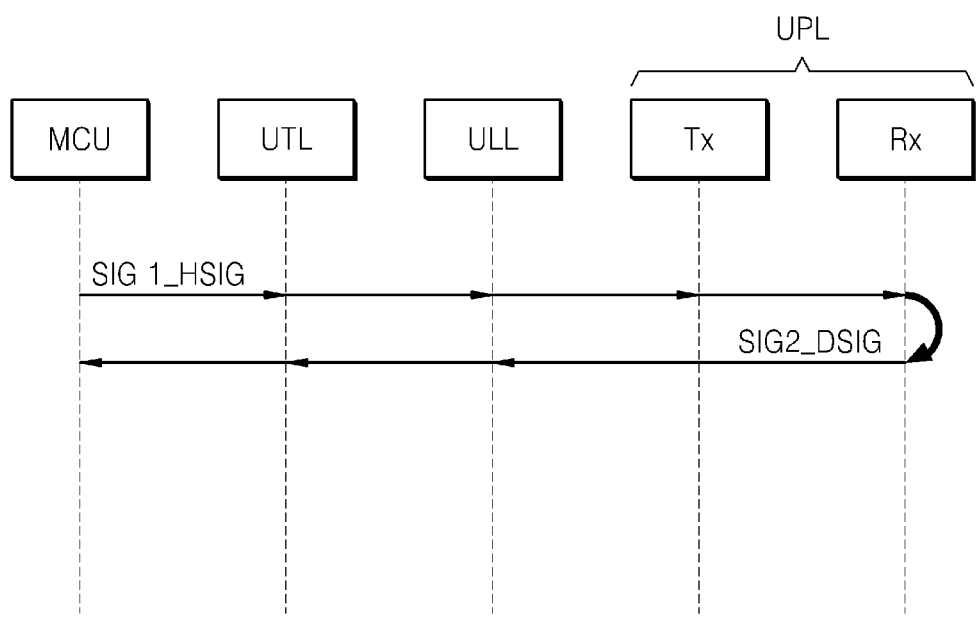
FIG. 19 is a flow diagram showing a data transmission and reception operation utilizing the UFS translator layer of FIG. 16, according to an embodiment of the inventive concept.

The memory device MDEV of FIG. 16 may test whether the reset operation, the lane control operation, and/or the message transmission and reception operation are performed normally through the UFS link layer ULL and the UFS physical layer UPL, as discussed above. The memory device MDEV of FIG. 16 also may test whether the lane control operation and/or the data transmission and reception operation is performed normally through the UFS translator layer UTL. FIGS. 18 and 19 are signal flow diagrams for describing the lane control operation and the data transmission and reception operation, respectively, utilizing the UFS translator layer UTL of FIG. 16, according to embodiments of the inventive concept.

The lane control operation and the data transmission and reception operation in the memory device MDEV of FIG. 16 are respectively identical to those of FIGS. 8, 13 and 14, except that the first and second signals SIG1 and SIG2 constituting the target signal DSIG are also used for a conversion process through the UFS translator layer UTL, as shown in FIGS. 18 and 19, for example. In other words, the first signal SIG1 constituting the target signal DSIG in FIG. 18 (e.g., SIG1_Y1_DSIG, SIG1_Y3_DSIG, SIG1_Y5_DSIG), indicating the lane control operation in the memory device MDEV of FIG. 16, is transmitted to the UFS link layer ULL through the UFS translator layer UTL, and the second signal SIG2 constituting the target signal DSIG (e.g., SIG2_Y2_DSIG, SIG2_Y4_DSIG) is transmitted to the test unit TU through the UFS link layer ULL and the UFS translator layer UTL. Effectively the same process is applied to FIG. 19 showing a data transmission and reception operation in the memory device MDEV of FIG. 16, similar to that of FIG. 14, although the second signal SIG2 constituting the target signal DSIG (e.g., SIG2_DSIG) is transmitted to the message control unit MCU of the test unit TU through the UFS link layer ULL and the UFS translator layer UTL. Further details thereof will not be repeated herein.

Figure 20:
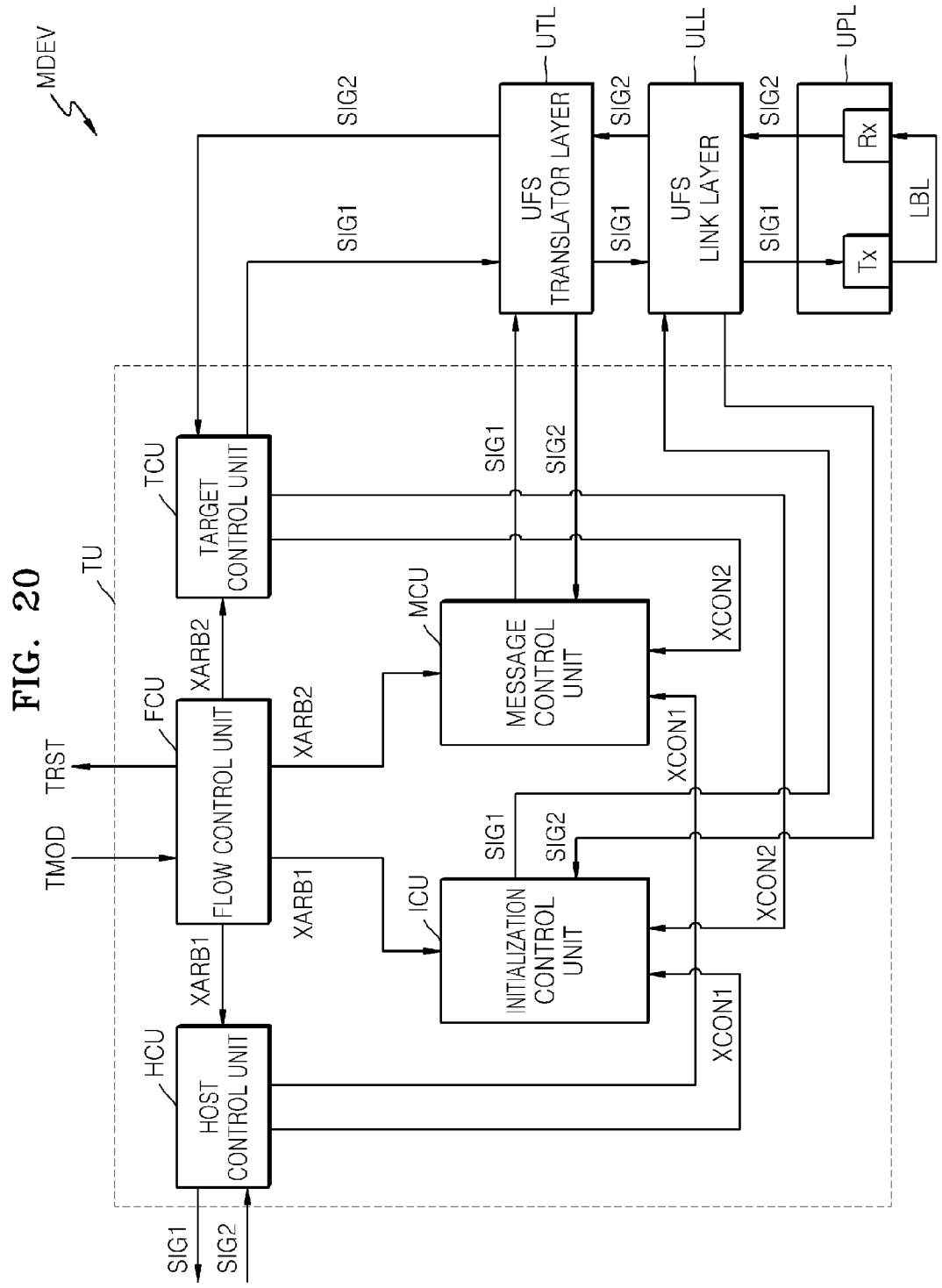
FIG. 20 is a block diagram of the test unit of FIG. 15 and the UFS translator layer of FIG. 16, according to an embodiment of the inventive concept.

FIG. 20 is a functional block diagram of the test unit TU of FIG. 15 combined with the UFS translator layer UTL of FIG. 16, according to an embodiment of the inventive concept.

Referring to FIG. 20, the test unit TU includes the flow control unit FCU, the target control unit TCU, the host control unit HCU, the initialization control unit ICU, and the message control unit MCU. Operations of the flow control unit FCU, the target control unit TCU, the host control unit HCU, the initialization control unit ICU, and the message control unit MCU of FIG. 20 are identical to those of FIG. 15. However, the first signal SIG1 generated by the target control unit TCU, the host control unit HCU, and the message control unit MCU of FIG. 20, and the second signal SIG2 received by the target control unit TCU, the host control unit HCU, and the message control unit MCU of FIG. 20, may be converted by the UFS translator layer UTL. Illustrative converting operations by the UFS translator layer UTL are described above. In FIG. 20, connections between the first and second signals SIG1 and SIG2 of the host control unit HCU and the UFS translator layer UTL are not illustrated due to difficulty in illustration.

Notably, since a signal used to test the reset operation by the initialization control unit ICU is not required to be converted by the UFS translator layer UTL, the first signal SIG1 generated by the initialization control unit ICU and the second signal SIG2 transmitted to the initialization control unit ICU may be transmitted to or received from the UFS link layer ULL, instead of the UFS translator layer UTL.

According to a memory device according to the embodiments of the inventive concept, production costs may be reduced since tests can be performed on reset operation, a lane control operation, and a message transmission and reception operation without having to use an expensive test device. Also, according to the memory device, a test can still be performed even when a newly defined standard is applied.

Figure 21:
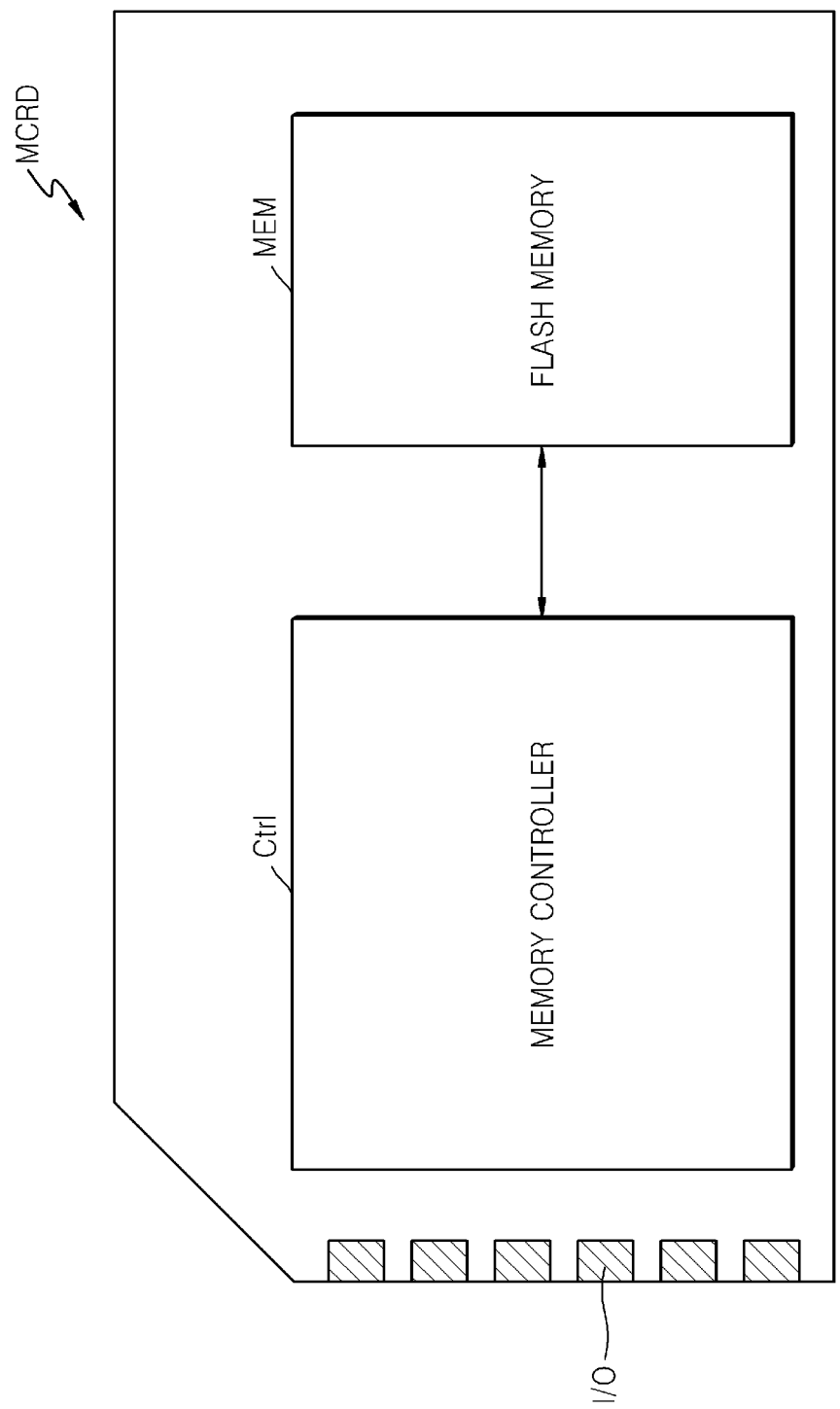
FIG. 21 is a block diagram of a memory card, according to an embodiment of the inventive concept.

FIG. 21 is a block diagram of a memory card MCRD, according to an embodiment of the inventive concept.

The memory device MDEV may be realized as the memory card MCRD of FIG. 21. The memory card MCRD includes a memory controller Ctrl and a memory MEM. The memory controller Ctrl writes data in or reads data from the memory MEM in response to a request of an external host (not shown) received through an input/output unit I/O. Also, when the memory MEM of FIG. 21 is a flash memory device, as shown in the illustrative embodiment, the memory controller Ctrl may control erase operations of the memory MEM. In order to perform such control operations, the memory controller Ctrl of the memory card MCRD may include interface units (not shown) respectively interfacing with the external host and a memory device, and a RAM. According to the memory card MCRD, a test for communication with the host device may be performed at a low cost or by quickly adapting to changing technologies.

The memory card MCRD of FIG. 21 may be realized as a compact flash card (CFC), a microdrive, a smart media card (SMC), a multimedia card (MMC), a security digital card (SDC), a memory stick, or a USB flash memory drive, for example.

Figure 22:
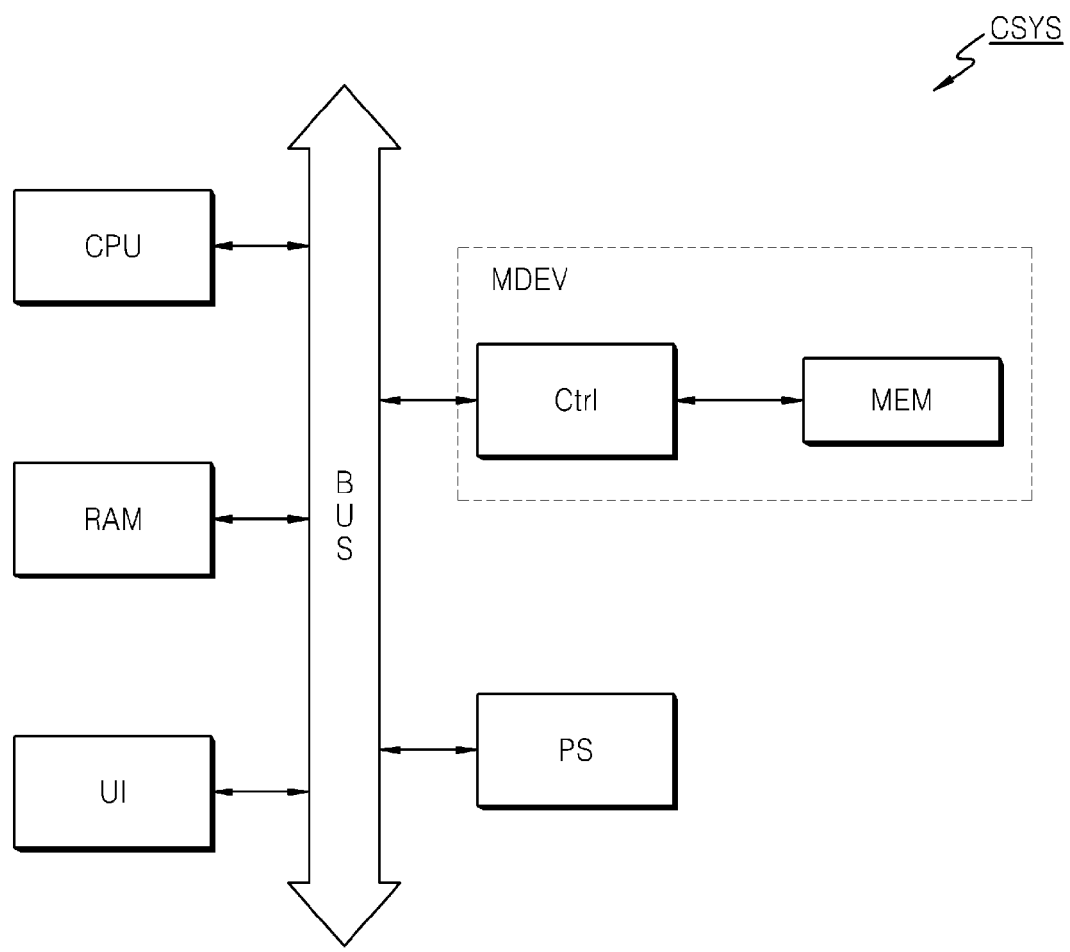
FIG. 22 is a block diagram of a computer system, according to an embodiment of the inventive concept.

FIG. 22 is a block diagram of a computing system device CSYS, according to an embodiment of the inventive concept.

Referring to FIG. 22, the computing system device CSYS includes a processor CPU, a user interface UI, and a memory device MDEV, which are electrically connected to a bus BUS. The memory device MDEV includes a memory controller Ctrl and a memory MEM. N-bit data (where N is an integer greater than or equal to 1) processed or to be processed by the processor CPU is stored in the memory MEM through the memory controller Ctrl. Also, the memory device MDEV, included in the computing system device CSYS of FIG. 22, may be a memory device MDEV as described above. Accordingly, the computing system device CSYS of FIG. 22 may perform a test for communication with the memory device MDEV at lost cost or by quickly adapting to changing technologies.

The computing system device CSYS may further include a power supply device PS. Also, if the memory MEM is a flash memory, the computing system device CSYS may further include a volatile memory device, such as RAM.

When the computing system device CSYS is a mobile device, the computing system device CSYS may further include a battery and a modem such as a baseband chipset for supplying an operation voltage. Also, the computing system device CSYS may further include an application chipset, a camera image processor (CIS), a mobile DRAM, or the like, although details thereof are not included as this would be apparent to one of ordinary skill in the art.

Figure 23:
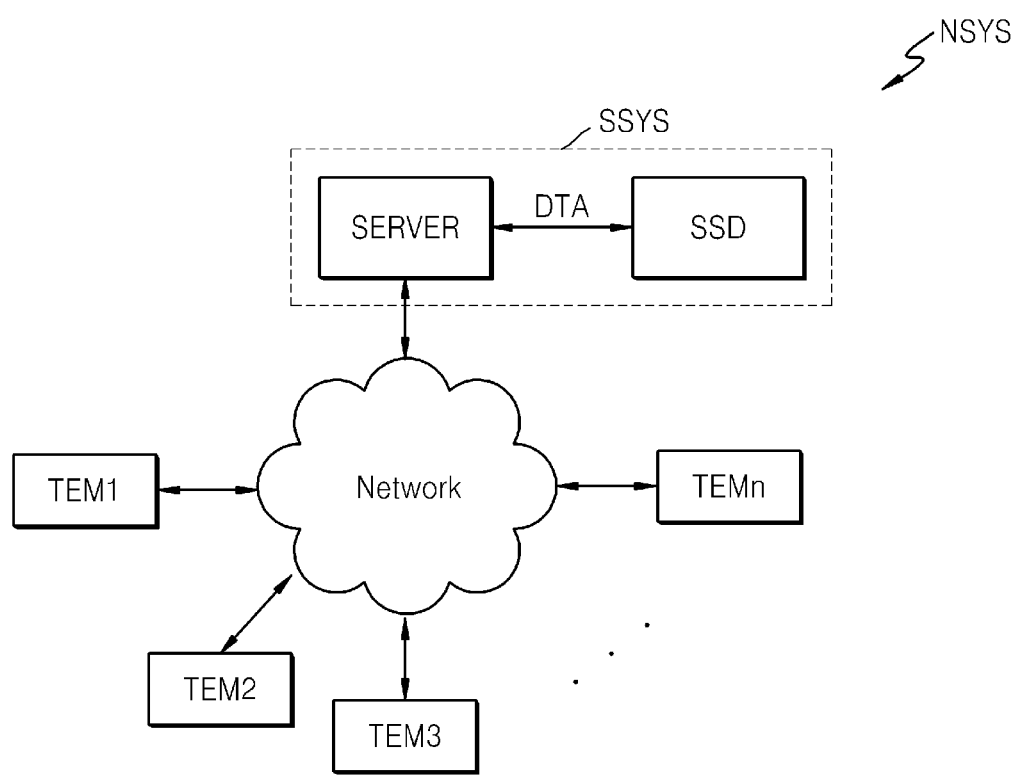
FIG. 23 is a block diagram of a network system including a server system with a solid state drive (SSD), according to an embodiment of the inventive concept.

FIG. 23 is a block diagram of a network system NSYS including a server system SSYS including an SSD, according to an embodiment of the inventive concept.

Referring to FIG. 23, the network system NSYS may include the server system SSYS and terminals TEM1 through TEMn, which are connected through a network. The server system SSYS may include a server for processing a request received from the terminals TEM1 through TEMn, and the SSD for storing data corresponding to the request received from the terminals TEM1 through TEMn. The SSD of FIG. 23 may be the SSD of FIG. 5, for example. In other words, the SSD of FIG. 23 includes the SSD controller SCTL and the memory MEM, and the SSD controller SCTL or the memory MEM may include the test unit TU according to an embodiment of the inventive concept. Accordingly, using the server system SSYS of the network system NSYS of FIG. 23, a test for communication with a host device may be performed at low cost or by quickly adapting to changing technologies.

Terminologies used herein are for descriptive purposes only, and are not used to limit meanings or ranges of claims. For example, the initialization control unit ICU and the message control unit MCU are shown to be controlled by the host control unit HCU or the target control unit TCU, but embodiments are not limited thereto. In other words, the initialization control unit ICU and the message control unit MCU of the memory device MDEV may independently perform the reset operation and the message transmission and reception operation, respectively, without being controlled by the host control unit HCU or the target control unit TCU. Here, the initialization control unit ICU and the message control unit MCU may each include a host command set or a target command set.

While the inventive concept has been particularly shown and described with reference to exemplary embodiments thereof, it will be understood that various changes in form and details may be made therein without departing from the spirit and scope of the following claims.

What is claimed:

1. A method of performing a self-test on a memory device in a test mode, the memory device comprising a memory controller coupled to a flash memory, the memory controller including a host interface, the method comprising:
generating a first signal;
sending the first signal from a test unit of the host interface through a universal flash storage (UFS) link layer of the host interface to a transmitting unit in a UFS physical layer of the host interface to be transmitted to a receiving unit in the UFS physical layer;
receiving a second signal at the test unit from the receiving unit in the UFS physical layer through the UFS link layer, the second signal being the first signal received by the receiving unit; and
testing an operation performed by at least one of the UFS physical layer and the UFS link layer based on the first signal and the second signal.

2. The method of claim 1, further comprising:
generating a test result signal in response to receiving the second signal, the test result signal indicating whether the operation has been performed normally by the at least one of the UFS physical layer and the UFS link layer.

3. The method of claim 1, further comprising:
determining one of a host mode and a target mode for generating the first signal and receiving the second signal, wherein the test unit operates as a host device external to the memory device in the host mode, and the test unit operates as the memory device in the target mode.

4. The method of claim 3, wherein determining one of the host mode and the target mode comprises:
receiving a mode control signal at the test unit indicating one of the host mode and the target mode;
generating a first arbitration signal in response to the mode control signal indicating the host mode, and at least one of generating the first signal and receiving the second signal at a host control unit in the host mode in response to the first arbitration signal; and generating a second arbitration signal in response to the mode control signal indicating the target mode, and at least one of generating the first signal and receiving the second signal at a target control unit in the target mode in response to the second arbitration signal.

5. The method of claim 4, wherein the operation comprises at least one of a reset operation for initializing the UFS link layer and the UFS physical layer, a lane control operation for providing a lane between the UFS physical layer and the host device, or a message transmission and reception operation for transmitting and receiving data by the UFS link layer and the UFS physical layer.

6. The method of claim 5, wherein testing performance of the lane control operation comprises:
generating and sending the first signal as a lane discovery standby notice signal in the target mode;
receiving the second signal as the lane discovery standby notice signal in the host mode to perform discovery of the lane; and
generating and sending the first signal as a lane discovery complete signal in the host mode.

7. The method of claim 6, wherein testing performance of the lane control operation further comprises:
generating and sending the first signal as a lane realignment standby notice signal in the target mode in response to the lane discovery complete signal; and
receiving the second signal as the lane realignment standby notice signal in the host mode to perform lane realignment; and
generating and sending the first signal as a lane realignment complete signal in the host mode.

8. The method of claim 7, wherein testing performance of the lane control operation further comprises:
generating and sending the first signal as a lane termination standby notice signal in the target mode in response to the lane realignment complete signal; and
receiving the second signal as the lane termination standby notice signal in the host mode to perform the lane termination,
wherein the performance of the lane control operation is determined to in accordance with UFS protocol when the generating of the first signal and the receiving of the second signal are sequentially performed.

9. The method of claim 5, wherein testing performance of the reset operation comprises:
generating and sending the first signal as a host reset signal to a device management entity (DME) of the UFS link layer in the host mode via an initialization control unit in response to a first control signal from the host control unit, the DME sending host layer reset signals to a plurality of layers of the UFS link layer to perform the reset operation and receiving a host reset complete signal;
sending the host reset signal constituting the first signal to the transmitting unit of the UFS physical layer to be transmitted to the receiving unit in response to the host reset complete signal; and
receiving the host reset signal as the second signal at the initialization control unit from the receiving unit in the UFS physical layer.

10. The method of claim 5, wherein testing performance of the reset operation comprises:
generating and sending the first signal as a target reset signal to a device management entity (DME) of the UFS link layer in the target mode via an initialization control unit in response to a second control signal from the target control unit, the DME sending target layer reset signals to the plurality of layers of the UFS link layer to perform the reset operation and receiving a target reset complete signal;
sending the target reset signal constituting the first signal to the transmitting unit of the UFS physical layer to be transmitted to the receiving unit in response to the target reset complete signal; and
receiving the target reset signal as the second signal at the initialization control unit from the receiving unit in the UFS physical layer.

11. The method of claim 5, wherein testing performance of the message transmission and reception operation comprises:
generating and sending the first signal as a target data signal from a message control unit to the transmitting unit of the UFS physical layer, via the UFS link layer, to be transmitted by the transmitting unit in the UFS physical layer in response to a second control signal from the target control unit;
receiving the target data signal as the second signal at the message control unit from the receiving unit in the UFS physical layer; and
comparing the second signal and the first signal to test whether data provided by the memory device is normally transmittable to the host device.

12. The method of claim 5, wherein testing performance of the message transmission and reception operation comprises:
generating and sending the first signal as a host data signal from a message control unit to the transmitting unit of the UFS physical layer, via the UFS link layer, to be transmitted by the transmitting unit in the UFS physical layer in response to a first control signal from the host control unit;
receiving the host data signal as the second signal at the message control unit from the receiving unit in the UFS physical layer; and
comparing the second signal and the first signal to test whether data provided by the host device is normally transmittable in the memory device.

13. The method of claim 4, wherein the first signal sent from the test unit is received by a UFS translator layer, which adds predetermined information relating to the first signal to a header of the first signal.

14. The method of claim 4, wherein predetermined information relating to the second signal, included in a header of the second signal, is decoded by a UFS translator layer, the method further comprising:
receiving the decoded predetermined information at the test unit from the UFS translator layer.

15. A memory device having self-test capability in a test mode, the memory device comprising:
a flash memory; and
a memory controller configured to control the flash memory and including a bus and a host interface coupled to the bus;
wherein the host interface comprises:
a universal flash storage (UFS) physical layer including a transmitting unit configured to output a first signal and a receiving unit configured to receive the first signal via a loop-back line (LBL) as a second signal, according to UFS protocol;
a UFS link layer configured to pass the first signal to the transmitting unit and to pass the second signal from the receiving unit, according to the UFS protocol; and
a test unit, operatively coupled between the bus and the UFS link layer, configured to test whether the UFS physical layer and the UFS link layer normally operate according to the UFS protocol by generating and transmitting the first signal to the UFS link layer and receiving the second signal from the UFS link layer.

16. The memory device of claim 15, wherein the test unit comprises:
a flow control unit configured to receive a test mode signal indicating one of a host mode or a target mode, and to generate a first arbitration signal in the host mode and a second arbitration signal in the target mode in response to the test mode signal; and
a test operation unit configured to receive the first and second arbitration signals from the flow control unit, to at least one of generate the first signal and receive the second signal in the host mode in response to the first arbitration signal, and to at least one of generate the first signal and receive the second signal in the target mode in response to the second arbitration signal.

17. The memory device of claim 16, wherein the test operation unit comprises:
a host control unit activated in response to the first arbitration signal, and configured to generate the first signal as a host signal and to receive the second signal as the host signal in the host mode; and
a target control unit activated in response to the second arbitration signal, and configured to generate the first signal as a target signal and to receive the second signal as the target signal in the target mode.

18. The memory device of claim 16, wherein the flow control unit comprises a state machine.

19. The memory device of claim 17, wherein the test operation unit further comprises:
an initialization control unit for testing whether the UFS link layer operates in accordance with UFS protocol during a reset operation.

20. The memory device of claim 19, wherein the initialization control unit is configured to generate and send the first signal as a host reset signal to a device management entity (DME) of the UFS link layer in the host mode in response to a first control signal from the host control unit,
wherein the DME is configured to send host layer reset signals to a plurality of layers of the UFS link layer to perform the reset operation and to receive a host reset complete signal, and further to send the host reset signal constituting the first signal to the transmitting unit of the UFS physical layer to be transmitted to the receiving unit in response to the host reset complete signal, and
wherein the initialization control unit is further configured to receive the host reset signal as the second signal from the receiving unit in the UFS physical layer.

21. The memory device of claim 20, wherein the initialization control unit is further configured to generate and send the first signal as a target reset signal to the DME in the target mode in response to a second control signal from the target control unit,
wherein the DME is configured to send target layer reset signals to the plurality of layers of the UFS link layer to perform the reset operation and to receive a target reset complete signal, and further to send the target reset signal constituting the first signal to the transmitting unit of the UFS physical layer to be transmitted to the receiving unit in response to the target reset complete signal, and
wherein the initialization control unit is further configured to receive the target reset signal as the second signal from the receiving unit in the UFS physical layer, and to determine whether the reset operation is performed in accordance with the UFS protocol based on at least one of the first signal and the second signal.

22. The memory device of claim 17, wherein the test operation unit further comprises:
a message control unit for testing whether the UFS physical layer and the UFS link layer transmit and receive data in accordance with UFS protocol by performing a message transmission and reception operation.

23. The memory device of claim 22, wherein the message control unit is configured to generate and send the first signal as a target data signal to the transmitting unit of the UFS physical layer, via the UFS link layer, to be transmitted to the receiving unit in response to a second control signal from the target control unit, to receive the target data signal as the second signal from the receiving unit in the UFS physical layer, and to compare the second signal and the first signal to test whether data provided by the memory device is transmittable to the host device in accordance with UFS protocol.

24. The memory device of claim 22, wherein the message control unit is configured to generate and send the first signal as a host data signal to the transmitting unit of the UFS physical layer, via the UFS link layer, to be transmitted to the receiving unit in response to a first control signal from the host control unit, to receive the host data signal as the second signal from the receiving unit in the UFS physical layer, and to compare the second signal and the first signal to test whether data provided by the host device is normally transmittable in the memory device in accordance with the UFS protocol.

25. The memory device of claim 17, wherein the memory device further comprises:
a UFS translator layer configured to receive the first signal from the target control unit, to add predetermined information relating to the first signal to a header of the first signal, and to transmit the first signal to the UFS link layer.

26. The memory device of claim 25, wherein the UFS translator layer is further configured to receive the second signal from the UFS link layer, to decode predetermined information relating to the second signal included in a header of the second signal, and to transmit at least one of the second signal and the decoded predetermined information to the target control unit.

27. A memory device having self-test capability, the memory device comprising a flash memory and a memory controller controlling the flash memory, the memory controller including a bus and a host interface coupled to the bus, the host interface comprising:
a universal flash storage (UFS) physical layer including a transmitting unit configured to output a first signal and a receiving unit configured to receive the first signal via a loop-back line (LBL) as a second signal;
a UFS translator layer for at least one of adding predetermined information relating to the first signal to a header of the first signal, and detecting predetermined information relating to the second signal in a header of the second signal;
a UFS link layer configured to pass the first signal from the UFS translator layer to the transmitting unit in the UFS physical layer and to pass the second signal from the receiving unit in the UFS physical layer to the UFS translator layer; and
a test unit configured to test whether the UFS physical layer and the UFS link layer normally operate according to UFS protocol by generating and transmitting the first signal to the UFS translator layer and receiving the second signal and the detected predetermined information relating to the second signal from the UFS translator layer.

28. The memory device of claim 27, wherein the test unit further comprises:
a message control unit for testing whether the UFS physical layer and the UFS link layer normally transmit and receive data by performing a message transmission and reception operation, wherein the message control unit is configured to compare the second signal and the first signal to test at least one of whether data provided by the memory device is normally transmittable to a host device or data provided by the host device is normally transmittable in the memory device.

29. The memory device of claim 28, wherein the test unit further comprises:
an initialization control unit for testing whether the UFS link layer normally operates during a reset operation, wherein the initialization control unit is configured to generate and send the first signal as one of a host reset signal or a target reset signal to a device management entity (DME) of the UFS link layer, wherein the DME is configured to perform the reset operation in response and to send the one of the host reset signal and the target reset signal constituting the first signal to the transmitting unit of the UFS physical layer to be transmitted to the receiving unit, and
wherein the initialization control unit is further configured to receive the one of the host reset signal and the target reset signal as the second signal from the receiving unit in the UFS physical layer.

30. A test unit included in a host interface of a memory controller coupled to a flash memory, the test unit coupled a bus of the memory controller and to a universal flash storage (UFS) link layer and a UFS physical layer of the host interface, the UFS physical layer including a transmitting unit configured to output a first signal and a receiving unit configured to receive the first signal via a loop-back line (LBL) as a second signal, the test unit comprising:
a flow control unit configured to receive a test mode signal indicating one of a host mode or a target mode for a testing an operation of the memory device, and to generate a first arbitration signal in the host mode and a second arbitration signal in the target mode in response to the test mode signal, wherein the test unit operates as a host device external to the memory device in the host mode and operates as the memory device in the target mode;
a host control unit for at least one of generating the first signal as a host signal and receiving the second signal as the host signal in the host mode, in response to the first arbitration signal; and
a target control unit for at least one of generating the first signal as a target signal and receiving the second signal as the target signal in the target mode, in response to the second arbitration signal,
wherein the test unit is configured to transmit the first signal to the UFS link layer in one of the host mode and the target mode, and to receive the second signal from the UFS link layer in one of the host mode and the target mode, the UFS link layer passing the first and second signals between the test unit and the UFS physical layer, to test whether the UFS link layer and the UFS physical layer normally operate according to UFS protocol based on the first and second signals.

31. The test unit of claim 30, wherein the tested operation comprises at least one of a reset operation for initializing the UFS link layer and the UFS physical layer, a lane control operation for providing a lane between the UFS physical layer and the host device, or a message transmission and reception operation for transmitting and receiving data by the UFS link layer and the UFS physical layer.

32. The test unit of claim 30, wherein the flow control unit is further configured to generate a test result signal based on whether the generating of the first signal and the receiving of the second signal by at least one of the host control unit and the target control unit are performed.

* * * * *